United States Patent
Chung

(10) Patent No.: US 9,316,691 B2
(45) Date of Patent: Apr. 19, 2016

(54) METHOD AND APPARATUS FOR FAULT INJECTION

(75) Inventor: Sung Soo Chung, San Jose, CA (US)

(73) Assignee: Eigenix, San Jose, CA (US)

( * ) Notice: Subject to any disclaimer, the term of this patent is extended or adjusted under 35 U.S.C. 154(b) by 170 days.

(21) Appl. No.: 13/050,909

(22) Filed: Mar. 17, 2011

(65) Prior Publication Data
US 2012/0239993 A1 Sep. 20, 2012

(51) Int. Cl.
*G01R 31/28* (2006.01)
*G01R 31/3185* (2006.01)

(52) U.S. Cl.
CPC *G01R 31/318547* (2013.01); *G01R 31/318536* (2013.01)

(58) Field of Classification Search
USPC .................................................. 714/727, 742
See application file for complete search history.

(56) References Cited

U.S. PATENT DOCUMENTS

| | | | |
|---|---|---|---|
| 6,108,807 A * | 8/2000 | Ke | 714/726 |
| 7,284,159 B2 * | 10/2007 | Chakraborty et al. | 714/41 |
| 2003/0196179 A1 * | 10/2003 | Langford, II | 716/2 |
| 2008/0040637 A1 * | 2/2008 | Huang et al. | 714/729 |
| 2009/0235134 A1 * | 9/2009 | Guo et al. | 714/726 |
| 2011/0126064 A1 * | 5/2011 | Huang et al. | 714/726 |
| 2012/0144244 A1 * | 6/2012 | Dan et al. | 714/39 |

* cited by examiner

*Primary Examiner* — M. Mujtaba K Chaudry
(74) *Attorney, Agent, or Firm* — Guadalupe M. Garcia

(57) ABSTRACT

The present invention provides various circuits for injecting faults into a larger circuit, sometimes called circuit under test, or CUT. One type of fault injection circuit is a clock controlled fault injection circuit. This type of circuit uses internal scan chains as a way by which a fault injection operation is performed while a system clock is in the off state. Another type of fault injection circuit is a concurrent fault injection circuit. This type of fault injection circuit uses dedicated fault injection scan chains in parallel with or without internal scan chains. Yet another type of fault injection circuit is a hybrid fault injection circuit that uses both clock controlled and concurrent fault injection circuits. Other embodiments are disclosed and still other embodiments would be obvious to those of ordinary skill in the art upon understanding the full scope of the present disclosure.

37 Claims, 21 Drawing Sheets

600

|  | \multicolumn{4}{c}{Injected Fault Value (F_Sel_1, F_Sel_0)} |
|---|---|---|---|---|
| (F_Control, FI_SO) | 00 | 01 | 11 | 10 |
| 00 | 0 | 0 | 0 | 0 |
| 01 | 1 | 1 | 1 | 1 |
| 11 | 1 | 0 | 0 | 1 |
| 10 | 0 | 0 | 1 | 1 |

No fault, bypass: 00, 01
fault: 11, 10

System Value 1
(F_Sel_1, F_Sel_0)
00 01 11 10

F_Control
0 | 1 1 1 1
1 | 1 0 0 1

802

System Value 0
(F_Sel_1, F_Sel_0)
00 01 11 10

F_Control
0 | 0 0 0 0
1 | 0 0 1 1

| (Sys_DI, F_Control) | Injected Fault Value (F_Sel_1, F_Sel_0) | | | |
|---|---|---|---|---|
| | 00 | 01 | 11 | 10 |
| Sys_DI = 0 | | | | |
| 00 | 0 | 0 | 0 | 0 |
| 01 | 0 | 0 | 1 | 1 |
| Sys_DI = 1 | | | | |
| 11 | 1 | 0 | 0 | 1 |
| 10 | 1 | 1 | 1 | 1 |

| (Sys_DI, F_Control) | Injected Fault Value | |
|---|---|---|
| | F_Sel_0 | |
| | 0 | 1 |
| Sys_DI = 0 | | |
| 00 | 0 | 0 |
| 01 | 0 | 1 |
| Sys_DI = 1 | | |
| 11 | 0 | 1 |
| 10 | 1 | 1 |

METHOD AND APPARATUS FOR FAULT INJECTION

FIELD OF THE INVENTION

The present invention generally relates to the field of circuit testing. More particularly, the present invention relates to fault injection and scan operation.

BACKGROUND OF THE INVENTION

High energy sub-atomic particles occasionally hit integrated circuit (IC) devices and cause interference. When an energetic particle hits an IC chip it may ionize an atom within the circuitry and thereby cause a single event effect to occur. There are several types of single event effects that can occur. The more severe effects include single event burnout and single event latchup. A less severe type of single event effect is a single event upset (SEU).

An SEU is a change of state or a transient pulse through an IC device caused by an ionizing particle. An SEU will manifest itself either by flipping the state of a sequential logic component (such as a memory or a flip-flop), commonly referred to as a "bit flip," or by introducing a transient pulse through a circuit that temporarily alters the values passing through combinational logic.

An SEU typically does not permanently affect the device and the device will continue to operate normally after the SEU occurs, although data may be corrupted. SEU and other single event effects are very common in outer space beyond the protection of the Earth's atmosphere against cosmic radiation. Therefore, IC devices used in outer space must be specially designed to limit this problem. On Earth, most energetic particles that could cause SEU are blocked by the atmosphere. However, energetic neutrons often make it through to the ground.

The neutron flux in New York City is approximately 14-20 neutrons per hour per square centimeter. However, at higher altitudes, the flux increases. For example, in Denver, Colo., the neutron flux is about 7 or 8 times higher than in New York City. Similarly, the flux is high on a commercial or military airplane flight. SEU has traditionally been much more prevalent in memory devices, particularly within SRAM. However, as device geometries shrink and clock speeds increase, SEU is becoming more prevalent in logic circuits. The SEU error rate in logic circuits is beginning to approach the rate found in memory devices of similar geometries.

It is possible to test an IC device for SEU. This usually involves applying a high energy particle beam at the device and counting the number of SEU's observed. One conventional method of doing this is by operating the device in normal mode and analyzing portions of the device at a time by counting errors in multiple signal lines at once. Another conventional method utilizes scan chains to test for SEU in sequential logic by leaving the sequential logic to be tested unclocked (i.e., in a static state) while applying the particle beam and then re-applying the clock in order to scan out the data within the scan chain and count the errors.

This type of SEU testing can be expensive and time consuming. Accordingly, there is a need to be able to efficiently test the susceptibility of a circuit to SEU errors. Likewise, there is a need by which to inject faults such as those introduced by Single Event Transient (SET) into a circuit so as to then test the susceptibility of the circuit to the faults and SEUs.

SUMMARY OF THE INVENTION

The present invention provides various circuits for injecting faults into a larger circuit, sometimes called a circuits under test, or CUT.

A first type of fault injection circuit is a clock controlled fault injection circuit. This type of circuit uses internal scan chains as a way by which a fault injection operation is performed while a system clock is in the off state. After the fault injection operation is completed, the system resumes its normal operation with the fault injected state. A circuit to be described further below that falls under this category is a fault injection circuit that shares a system's scan chain for fault injection. This shared scan chain fault injection circuit uses a clock controlled fault injection method.

A second type of fault injection circuit is a concurrent fault injection circuit. This type of fault injection circuit uses dedicated fault injection scan chains in parallel with or without internal scan chains. In this type of circuit, fault injection is performed while a system is in an operational mode. This dedicated scan chain fault injection circuit uses a concurrent fault injection method.

A third type of fault injection circuit is a hybrid fault injection circuit that uses both clock controlled and concurrent fault injection circuits. Emulation and hardware accelerated emulators can benefit from this hybrid fault injection circuit.

Other embodiments are disclosed and still other embodiments would be obvious to those of ordinary skill in the art upon understanding the full scope of the present disclosure.

BRIEF DESCRIPTION OF THE DRAWINGS

The following drawings will be used to more fully describe embodiments of the present invention.

FIG. 5 is a Karnaugh map of a fault injection circuit according to an embodiment of the invention.

FIG. 8 is a Karnaugh map of a single cell fault injection circuit according to an embodiment of the invention.

FIG. 14 is a Karnaugh map of a single cell fault injection circuit according to an embodiment of the invention.

FIG. 17 is a Karnaugh map of a single cell fault injection circuit according to an embodiment of the invention.

DETAILED DESCRIPTION OF THE INVENTION

The present invention generally relates to circuits for injecting faults into a larger circuit. Fault injection can be useful because it provides information about the susceptibilities of a circuit to, among other things, single event upsets (SEUs). For example, where certain naturally induced SEUs may occur with low frequency, they may nonetheless, have a dramatic effect on a circuit. Whereas tools exist for bombarding a circuit with high frequency radiation so as to simulate an accelerated lifetime of a circuit, such tools can be expensive and time-consuming. The present invention therefore provides circuits by which faults can be injected so as to test larger circuits vulnerabilities to SEU.

Fault Injection and Resulting CUT Behavior

Figure 1:
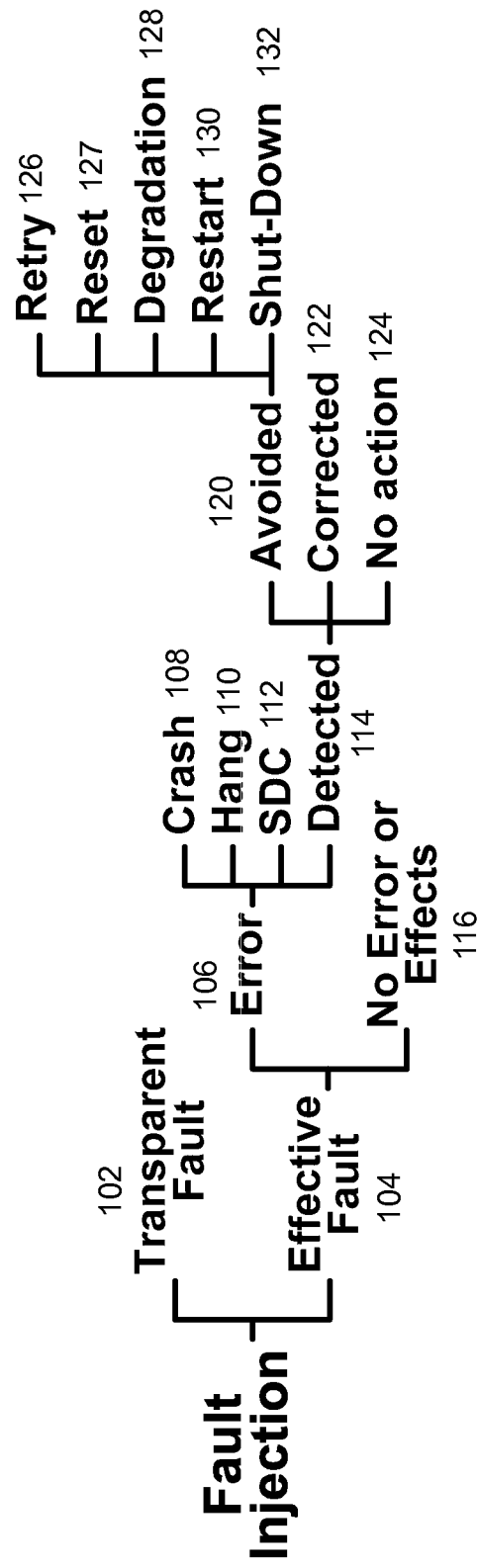
FIG. 1 is a diagram of the various types of fault effects that are results of faults injected into a circuit according to an embodiment of the present invention.

Shown in FIG. 1 are the various types of fault effects that are a result of faults injected into a circuit according to an embodiment of the present invention and the corresponding responses from a circuit under test (CUT) while the CUT is in operation.

For example, when a fault is injected it may be a transparent or effective fault, 102 and 104 respectively. A fault is said to be transparent when the injected node has the same logic state as the injected fault. A fault is said to be effective when the injected node has a different logic state from the injected fault.

If the fault is an effective fault various possibilities exist. For example, an effective fault turns the fault into an error 106 that may, in turn, result in a CUT crash 108, a hang 110, a silent data corruption (SDC) 112, or a detected error 114. Also, an effective fault 106 may cause a no error or effect 116 condition.

Of detected errors 114, they may be detected errors that can be avoided 120 or corrected 122 or detected errors where the system takes no action 124. Of the errors that can be avoided 120, they may require a retry 126 of an operation of the CUT to perform an error free operation, a reset 127 of the operation of the CUT, a degradation 128 of the operation of the CUT, restart 130 of the CUT, or a shut-down 132 of the CUT.

These are only examples of the effects of faults. Other effects may be possible. For example, classifications of error conditions from a CUT or system response may vary depending on the different responses generated by the error from a given CUT or system.

Fault Injection Operation

In testing a CUT, it is first necessary to consider the variety and types of faults that are to be injected in the testing. This is sometimes called generating a fault list and may include spatial as well as time domain faults. Once such a fault list is generated, a fault injection operation is similar to internal scan shift and capture operations to use a fault list as a scan shift data. A significant difference between fault injection and scan test operation are that during fault injection operations, it is desired to inject a limited number of faults in the selected scan cells while retaining all the previous states of the CUT in the unselected scan cells. Accordingly, the state of the CUT is read out and fed back into the circuit while replacing only the states of the nodes desired to be injected with a fault. For a fault injection operation, each scan shift operation (shift-out simultaneously captures data serially) for the selected scan chain is staggered by an amount of a fault injection interval predetermined by the time domain fault list. Overall fault injection operation consists of a total duration of all fault injection time which is comprised of individual time domain faults lists and that are selected ones of spatial domain fault lists. The time domain fault list consists of all spatial domain faults staggered by an amount of a fault injection interval of each spatial domain faults.

There are no real time comparisons of the serial output data during scan shift operations. Serial output data from the fault injection scan cells are stored for error rate and other SEU related analysis purposes after fault injection operation is completed as will be seen in the circuits to be described below.

Fault Injection Result Analysis

Through the use of the information recorded during fault injection testing, after fault injection operation is completed a detailed analysis of the CUT can be performed. For example, pass and fail response by the system test code running on the CUT can be recorded based on the results of fault injection testing. Moreover, a total number of faults that are injected during a fault injection operation can be used to estimate system a soft error rate (SER) for a CUT. There are following variables to estimate soft error rate from the fault injection operation. Information that can be obtained includes:

a) Total Number of Faults Injected
   b) Number of Failures for each error category from system test code response
   c) Fault Injection Duration
   d) Total Number of Flip-flops in the Design
   e) SER Value of each Flip-flop
   f) System Test Code Coverage
   g) System Test Code Response Latencies
   h) Functional Derating Factor
   i) Fault Injection Acceleration Factor Other vital information can also be obtained as known to those of skill in the art.

Fault Types during Fault Injection Operation

Fault injection according to the present invention uses three different types of faults that are injected to a CUT flip-flop or circuit node. They are (i) time invariant faults, which are known as Stuck-at fault where status of fault stays constant in terms of time, (ii) one-cycle soft faults, which are known as SEU faults where the status of the fault lasts one clock cycle, and (iii) less-than-one-cycle faults, which are known as SET faults where the status of the fault lasts less than one clock cycle. Additional soft faults can be defined such that the faults last more than one-cycle but are not time invariant faults. Each fault has specific characteristics for the purpose of analyzing SEU response of the circuit.

Stuck-at Fault

A stuck-at fault is time invariant such that the status of fault stays constant regardless of time durations. The effect of the fault is seen as stuck-at logic state at the node and is a hard fault. For fault injection operations, as in other analyses, the duration of a stuck-at fault is normally set to the entire test operation where the duration is longer than the latency of one system or test operation cycle. Global signals from a fault list control clock control circuits such that the duration of fault injection can be sustained during the fault injection operation cycle. The Stuck-at fault model is problematic for SEU analysis through fault injection operation and may be better suited for DFT analysis and DFT verification to determine test coverage of a target circuit.

Logic Upset Fault

A logic upset fault is time variant and soft in nature as oppose to a hard fault. For example, a logic upset fault can be overwritten with a new value during subsequent clock cycles and is, therefore, similar to certain characteristics of an SEU fault and can provide useful information in fault injection testing. During fault injection testing, fault duration can set to be a single or multiple system clock cycles. The fault can be synchronous with system clock where the fault can be asserted at the rising or falling edge of the clock. SER analysis involves not only fault models used in the fault injection operation but also uses various other information, such as system code coverage and latency, injection duration, acceleration factor, flip-flop SER, number of faults injected, and system response from the injected faults.

Logic Transient Fault

A logic transient fault is time variant and soft in nature as oppose to a hard fault. For example, a logic transient fault can be overwritten with a new value during subsequent clock cycles and is, therefore, similar to certain characteristics of an SEU fault and can provide useful information in fault injection testing. A difference from a logic upset fault is in the duration of the logic transient fault. The duration of a logic transient fault is less than one system clock cycle. The fault can occur at any time within the system clock window. In fault injection operations, a logic transient fault is controlled by a fault injection clock control circuit that can inject fault at any time within the system clock window. The logic transient fault model can be used to analyze SEU effects through fault injection operations. Specific types of circuits can benefit the best from this type of fault model, including circuits that implement a pipeline design and high speed SERDES IP blocks.

Each of the faults described above has specific applications and drawbacks for the purpose of analyzing SEU in a circuit.

For example, the effect of a single injected stuck-at fault can be multiplied at each clock cycle as the system propagates the single stuck-at fault, not only through the time domain but also through the spatial domain of the circuit. Stuck-at faults can be useful for DFT circuit coverage analysis and other on-chip test coverage and test circuit performance analysis. It is a static fault and provides advantages for static fault coverage analysis purposes.

A logic upset fault resembles an SEU fault such as a radiation induced logic upset. It is well suited for analyzing the effects of SEU in the design and is also well suited for developing SEU mitigation solutions. It also provides advantages for quantifying high-speed SERDES on-chip BER (bit error rate) test and performance characterization, which measures time variant fault than static fault.

A logic transient fault may provide further advantages for analyzing heavily pipelined design structures and high speed data buses where a single fault may propagate and multiply as transient signals are regenerated and diverged into a logic cone. Logic upset faults may have different side effects in this type of environment from logic transient faults where pulse width and pulse location within system clock cycle influence different error rates.

Fault Injection Circuits

The present invention provides various circuits for injecting faults into a larger circuit, sometimes called a circuits under test, or CUT. Several types of fault injection circuits are disclosed.

A first type of fault injection circuit is a clock controlled fault injection circuit. This type of circuit uses internal scan chains as a way by which a fault injection operation is performed while a system clock is in the off state. After the fault injection operation is completed, the system resumes its normal operation with the fault injected state. A circuit to be described further below that falls under this category is a fault injection circuit that shares a system's scan chain for fault injection. This shared scan chain fault injection circuit uses a clock controlled fault injection method.

A second type of fault injection circuit is a concurrent fault injection circuit. This type of fault injection circuit uses dedicated fault injection scan chains in parallel with or without internal scan chains. In this type of circuit, fault injection is performed while a system is in an operational mode. This dedicated scan chain fault injection circuit uses a concurrent fault injection method.

A third type of fault injection circuit is a hybrid fault injection circuit that uses both clock controlled and concurrent fault injection circuits. Emulation and hardware accelerated emulators can benefit from this hybrid fault injection circuit.

Other embodiments are disclosed and still other embodiments would be obvious to those of ordinary skill in the art upon understanding the full scope of the present disclosure.

Effects of Fault Injection

There are two different fault effects when a fault injection circuit injects a fault in the circuit node: a transparent fault or an effective fault.

An injected fault is a transparent fault when the injected fault and the logic value of the fault injection node are the same. For example, where the fault injection node has a logic value of 1 and the injected fault is also a 1, the injected fault is said to be transparent because it does not change the value at the injection node. In this case the fault injection circuit does not inject the fault in the node and bypasses the original value without change.

An injected fault is an effective fault when the injected fault and the logic value of the fault injection node are different. For example, where the fault injection node has a logic value of 1 and the injected fault is a logic value 0, the injected fault is said to be an effective fault because it changes the value at the injection node.

Example Shared Scan Chain Fault Injection Circuit 1

Figure 2:
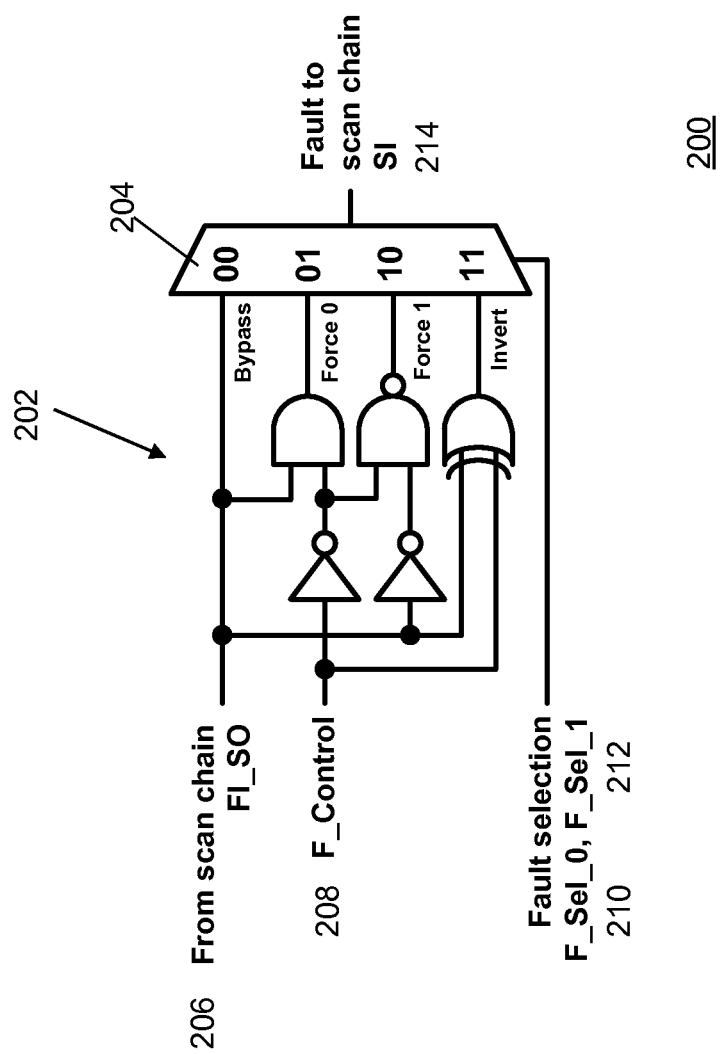
FIG. 2 is a schematic of a fault injection circuit that is shared with a scan chain of a CUT according to an embodiment of the invention.

Shown in FIG. 2 is circuit 200 that includes a fault injection circuit 202 that is connected to a scan chain of a system.

Fault control signal F_Control 208 and fault selection signals F_Sel_0 210 and F_Sel_1 212 and control whether fault injection is turned on or off, and when it is on, the selection signal controls the type of fault injection to be performed, respectively. If F_Control 208 is logic one then, a fault will be injected according to the value of fault selection signals F_Sel_0 210 and F_Sel_1 212.

Figure 3:
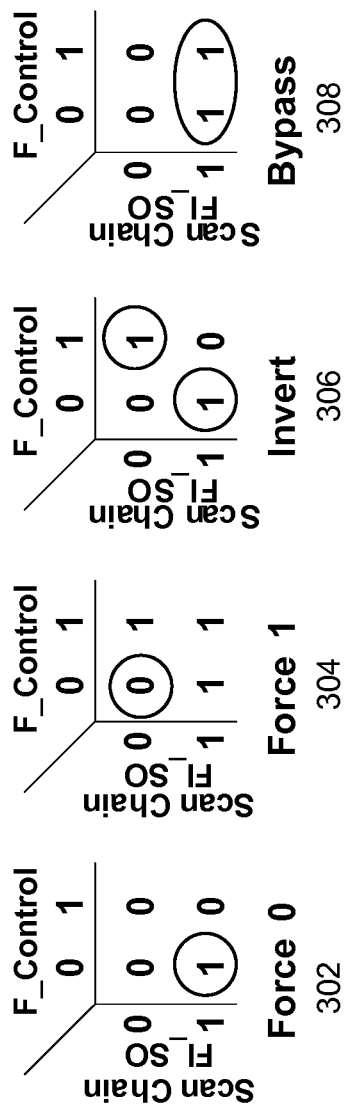
FIG. 3 is a Karnaugh map of a fault injection circuit according to an embodiment of the invention.

As shown, scan chain input signal FI_SO 206 is directed to multiplexer 204 such that, as shown, when [F_Sel_0, F_Sel_1] are set to [0 0], fault injection circuit 202 is bypassed. Shown in FIG. 3 is Karnaugh map 308 for this functionality.

When [F_Sel_0, F_Sel_1] is set otherwise, various aspects of fault injection circuit 202 are executed. For example, when [F_Sel_0, F_Sel_1] is set to [0 1], fault injection circuit 202 is configured to force a logic state of zero at output 214 that directs the fault to the scan chain of the system. Shown in FIG. 3 is Karnaugh map 302 for this functionality. Alternatively, when [F_Sel_0, F_Sel_1] is set to [1 0] fault injection circuit 202 is configured to force a logic state of one at output 214 that directs the fault to the scan chain of the system. Shown in FIG. 3 is Karnaugh map 304 for this functionality. Note that in the above two situations, an injected fault may or may not be an effective fault that changes the state of the fault injection node of interest.

In yet another condition, when [F_Sel_0, F_Sel_1] is set to [1 1] fault injection circuit 202 is configured to force an inversion of the logic state of the fault injection node of interest that is scan chain input signal as FI_SO at signal 206 such that every injected fault is an effective fault. Shown in FIG. 3 is Karnaugh map 306 for this functionality.

Example Shared Scan Chain Fault Injection Circuit 2

Figure 4:
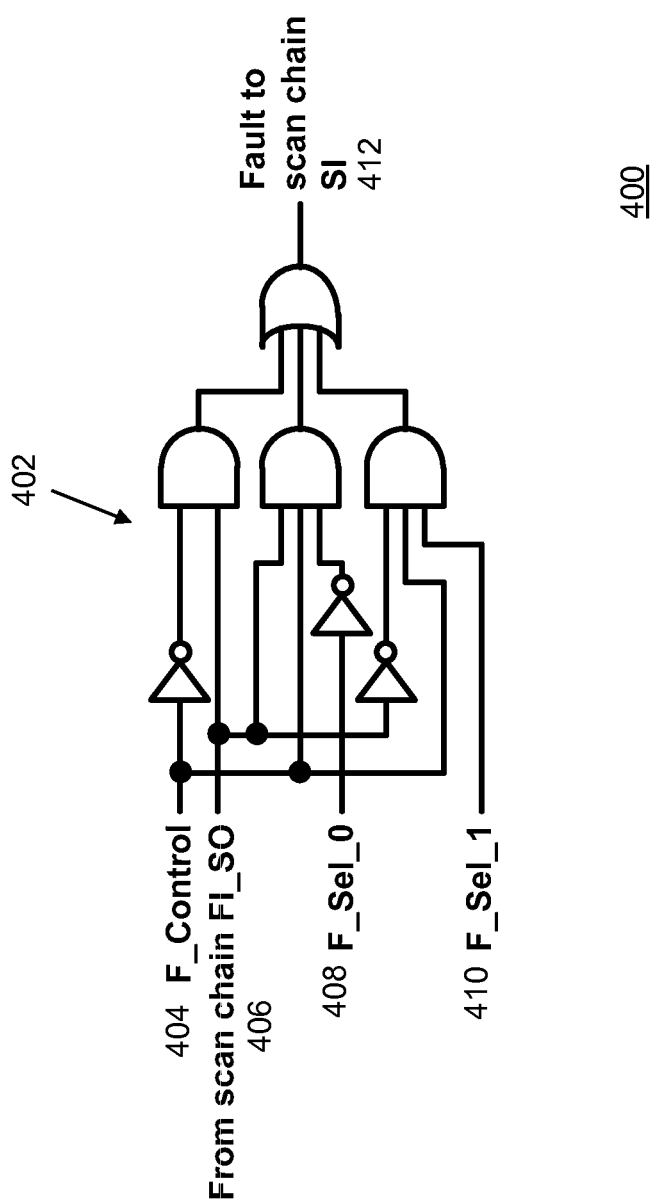
FIG. 4 is a schematic of a fault injection circuit that is shared with a scan chain of a CUT according to an embodiment of the invention.

Shown in FIG. 4 is circuit 400 that includes a fault injection circuit 402 that is shared with a scan chain of a system. Circuit 400 is similar to circuit 200 of FIG. 2 with certain differences. First, multiplexer 204 from FIG. 2 is integrated into the decoding logic of circuit 400 for a more compact design. Also, circuit 400 incorporates scan chain input signal FI_SO that will be explained further below.

Fault control signal F_Control 404 and fault selection signals F_Sel_0 408 and F_Sel_1 410 and control whether fault injection is turned on or off, and when it is on, the selection signal controls the type of fault injection to be performed, respectively. If F_Control 404 is logic one then, a fault will be injected according to the value of fault selection signals F_Sel_0 408 and F_Sel_1 410.

As shown, scan chain input signal FI_SO 406 is directed to fault injection circuit 402 such that, as shown, when [F_Sel_0, F_Sel_1] are set to [0 0], fault injection circuit 402 is effectively bypassed. Shown in FIG. 5 is Karnaugh map 502 for this functionality.

When [F_Sel_0, F_Sel_1] is set otherwise, various aspects of fault injection circuit 402 are executed. For example, when [F_Sel_0, F_Sel_1] is set to [0 1], fault injection circuit 402 is configured to force a logic state of zero at output 412 that directs the fault to the scan chain of the system. Shown in FIG. 5 is Karnaugh map 502 for this functionality. Alternatively, when [F_Sel_0, F_Sel_1] is set to [1 0] fault injection circuit 402 is configured to force a logic state of one at output 412 that directs the fault to the scan chain of the system. Shown in FIG. 5 is Karnaugh map 502 for this functionality. Note that in the above two situations, an injected fault may or may not be an effective fault that changes the state of the fault injection node of interest.

In yet another condition, when [F_Sel_0, F_Sel_1] is set to [1 1] fault injection circuit 402 is configured to force an inversion of the logic state of the fault injection node of interest that is scan chain input signal as FI_SO at signal 406 such that every injected fault is an effective fault. Shown in FIG. 5 is Karnaugh map 502 for this functionality.

Example Interface for Shared Scan Chain Fault Injection Circuit

Figure 6:
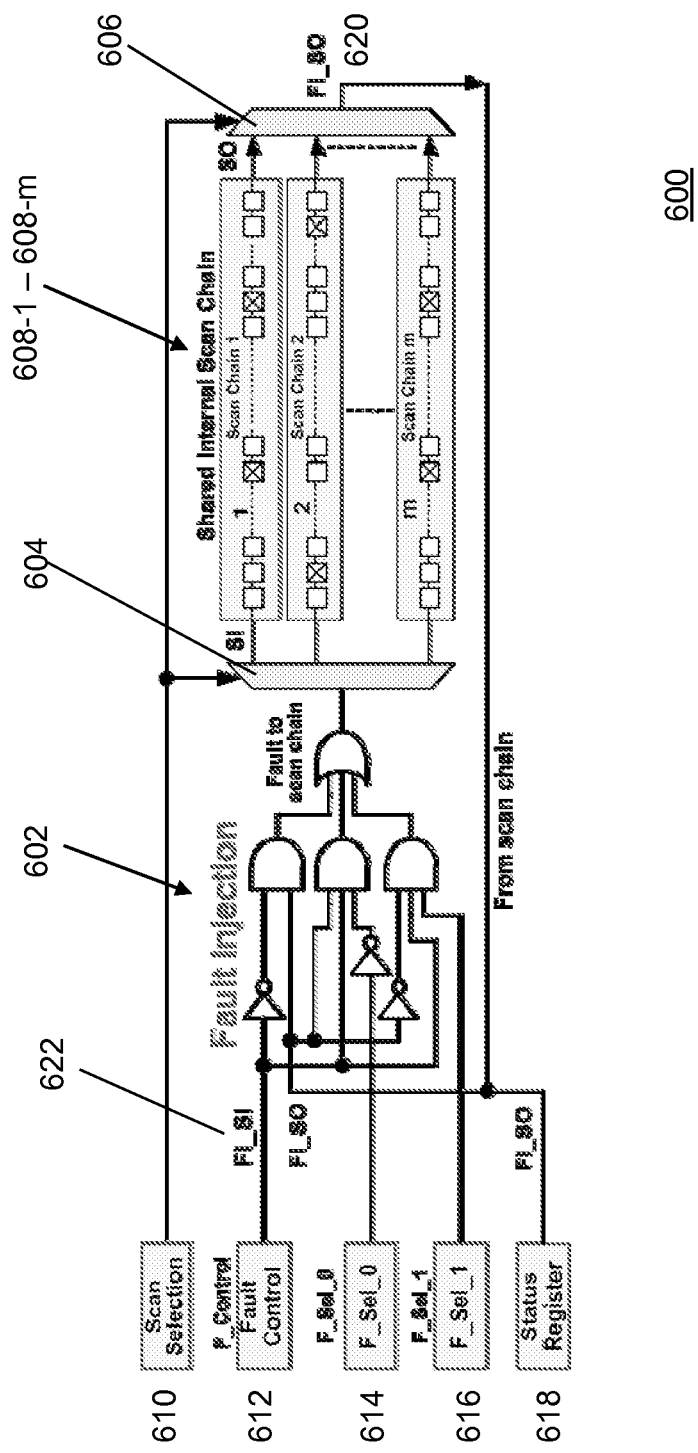
FIG. 6 is a schematic of a fault injection circuit that is shared with a scan chain of a CUT according to an embodiment of the invention.

Shown in FIG. 6 is a simplified block diagram 600 of a shared scan chain fault injection circuit. As shown, block diagram 600 includes internal scan chains 608-1 through 608-$m$ that are part of a scan chain structure for a device. Also shown is fault injection circuit 602 that is used to inject faults into the device. As shown for illustrative purposes, fault injection circuit 602 is circuit 402 of FIG. 4, but other circuits are also appropriate.

As shown, fault injection circuit 602 is able to inject faults into the device at the locations identified for the internal scan chain. Thus, an advantage of this shared scan chain approach is that the preexisting scan chain can be leveraged to also inject faults.

As shown in FIG. 6, Scan Selection signal 610 controls demultiplexer 604 and multiplexer 606 so as to control the type of scan operations to be performed. F_Control signal 612 is generated in accordance with a fault list so as to properly exercise the device for various fault conditions. Likewise, signal F_Sel_0 614 and F_Sel_1 616 and F_Control 612 are generated in accordance with a fault list so as to properly exercise the device for various fault conditions. Moreover, the operation of fault injection circuit 602 in response to these signals was described further above.

In operation, as FI_SI 622 is fed through a serial input signal, at least one of scan chains 608-1 through 608-$m$ is in scan shift mode and fault injection information is serially fed to FI_SI 622 from Fault Control signal F_Control 612. At the same time that scan chain input signal FI_SO 620 is shifted out as a serial output data form the shared internal scan chain and fed back into the scan chain after a fault is injected by fault injection circuit 602. FI_SO 620 is also directed to status register 618 for recordation. Such status register 618 information can subsequently be compared to FI_SI 622 information so as to determine situations of transparent or effective faults.

In addition, error diagnosis and fault analysis tools can utilize fault injection information (such as flip-flop instance name and location) to analyze the effect of the injected faults, duplicate an error condition of the fault injection cycle, and identify solutions for the given errors caused by the fault in the system.

Status register 618 collects vital fault injection information so that various analyses can be performed including system error rate analysis, error diagnosis, error duplication, error debugging and reliability improvement of the hardware and software.

Selected scan cell values will be injected with faults during the fault injection cycle and the all other scan cell values will be untouched and repositioned back into their original cell locations. Because of this, during the fault injection operation, the exact amount of shift operations for the given scan chain should provide for the previous state of the scan flip-flop to be loaded back into the original location.

When fault injection is completed, shared internal scan chains 608-1 through 608-$m$ are serially shifted out and at the same time shifted back into the original position through the scan shift operations.

Dedicated Fault Injection Circuit

A dedicated fault injection circuit is a concurrent fault injection circuit and uses dedicated fault injection scan chains with or without internal scan chain support. Fault injection operation is done while the system is in a mission mode of operation. The dedicated fault injection circuit enables designers to exercise fault injection operations while the target system is in an operational mode such that hardware and software response to the injected fault can be analyzed for reliability improvement.

To be discussed further below are six variations of dedicated fault injection circuits that include:
   a) Single Cell Fault Injection Circuit;
   b) Dual Cell Fault Injection Circuit;
   c) Alternative Single Cell Fault Injection Circuit;
   d) Single Cell Fault Injection Circuit with one Fault Selection Global Signal;
   e) Single Cell EXOR only Fault Injection Circuit with Internal Scan Support; and f) Single Cell EXOR only Fault Injection Circuit with no Internal Scan Support.

For some of the above-listed circuits, alternative embodiments will be described. It should, nevertheless, be understood that many circuit variations are possible without deviating from the teachings of the present invention.

As part of the present discussion two sets of scan control signals will be discussed:
a) Internal Scan Chain control signals and
b) Fault Injection Scan Chain control signals.

Both scan control signals are mutually exclusive in controlling the scan operations such that each scan operation is independent of another.

As will be further described below, when a system is in a mission mode of operation, internal scan control signal SE is put in an inactive state (SE=0) and the internal scan chain is also put in an inactive state where the internal scan chain is in a capture mode (non-scan shift mode). During a fault injection operation, a fault injection clock control circuit generates a signal Fault_SE that indicates that fault injection is enabled. At the moment of fault injection, depending on the selected clock cycle of the fault injection clock control circuit, the signal Fault_SE is briefly activated, and the scan enable signal becomes active (SE=1). During this operation, the scan enable signal is in an active cycle (SE=1) which lasts one system clock cycle (or selected clock cycles), the scan input path signal (SI) can be latched into the flip-flop at the rising edge of the next system clock cycle. The scan input path signal (SI) is fed by the output of fault injection scan cell output such that preloaded fault injection value in the fault injection scan cell can be latched into to the system flip-flop at the rising edge of the next system clock cycle.

These series of operations constitute a fault injection operation. Depending on the fault injection mode, the signal Fault_SE may last more than one clock cycle or less than one clock cycle because the signal duration determines the duration of fault injection for the given node.

Fault injection will now be described for certain particular circuits.

Example of Dedicated Single Cell Fault Injection Circuit

Figure 7:
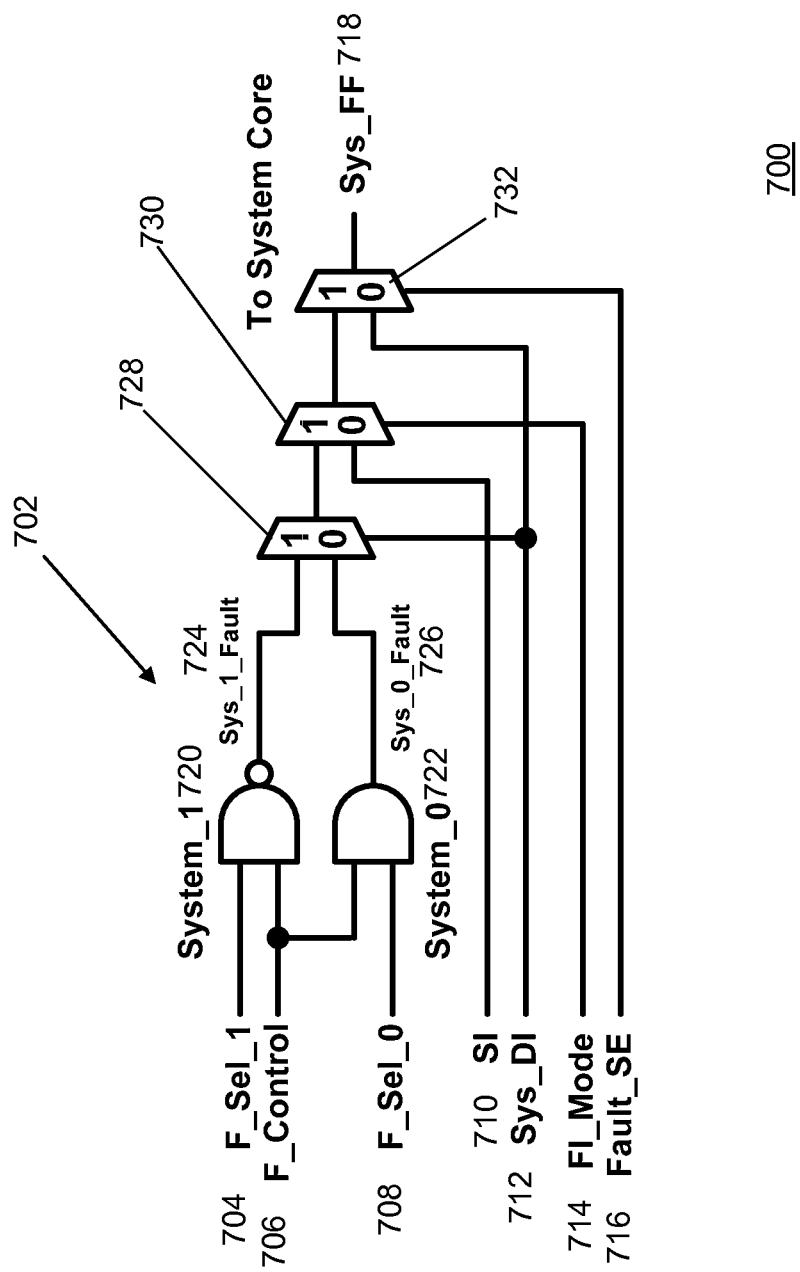
FIG. 7 is a schematic of a single cell fault injection circuit according to an embodiment of the invention.

Shown in FIG. 7 is a single cell fault injection circuit 700 that includes logic circuitry 702. As shown, fault selection is controlled by F_Sel_0 708 and F_Sel_1 704. Fault injection is controlled by F_Control 706 where F_Control 706 set to 1 activates fault injection and F_Control 706 set to 0 fault injection is deactivated or bypassed. System core data input is provided at Sys_DI 712 and internal scan serial input is provided at SI 710. Fault injection mode is controlled by FI_Mode 714 and a fault injection scan enable mode is controlled by Fault_SE 716. Output Sys_FF 718 provides system core data output during operation of single cell fault injection circuit 700.

Shown in FIG. 8 are Karnaugh maps 802 and 804 that describe the operation of fault injection circuit 700. More particularly, Karnaugh map 802 describes the operation of fault injection circuit 700 when a system value Sys_DI 712 is in logic 1 state at the moment of fault injection. Also, Karnaugh map 804 describes the operation of fault injection circuit 700 when a system value Sys_DI 712 is in logic 0 state at the moment of fault injection.

Figure 9:
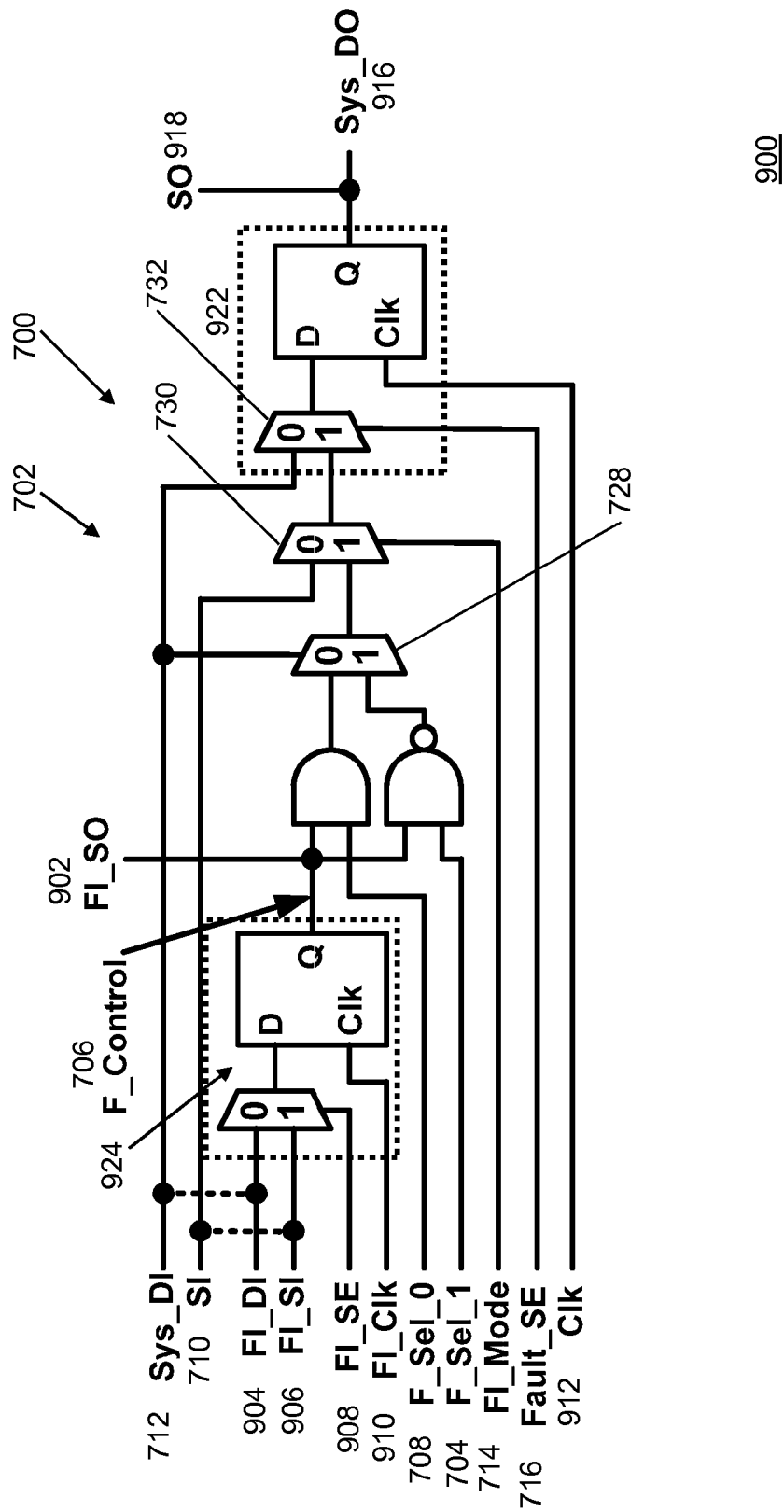
FIG. 9 is a schematic of a single cell fault injection circuit according to an embodiment of the invention.

Shown in FIG. 9 is combined fault injection scan cell and internal scan cell 900 that includes single cell fault injection circuit 700 that further includes logic circuitry 702 and the various signals described with reference to fault injection circuit 700. Combined fault injection scan cell and internal scan cell 900 includes FI_DI 904 that provides fault injection capture data input, FI_SI 906 that provides fault injection serial input to fault injection scan flip-flops 924, FI_SE 908 that provides fault injection scan enable mode control, and FI_Clk 910 that provides a fault injection shift clock and is used as a capture signal during a fault injection capture cycle. Combined fault injection scan cell and internal scan cell 900 further includes Clk 912 that provides a clocking input to flip-flop of the internal scan cell 922 that, in turn, provides Sys_DO 916 that is a system core data output and SO 918 that is a serial output of the internal scan flip-flop 922 during operation of combined fault injection scan cell and internal scan cell 900.

An important consideration of combined fault injection scan cell and internal scan cell 900 is the interaction of FI_SE 908 and FI_Mode 714. Shown in the table below are the various states of [FI_SE, FI_Mode] and a description of the responsive operation of combined fault injection scan cell and internal scan cell 900.

| FI_SE | FI_Mode | Description |
|---|---|---|
| 0 | 0 | Both the fault injection scan cell and internal scan cell are in functional mode which is non-scan shift mode |
| 0 | 1 | Internal scan cell is in scan shift mode, fault injection scan cell is in functional mode |
| 1 | 0 | Internal scan cell is in functional mode, fault injection scan cell is in shift mode |
| 1 | 1 | Both internal scan cell and fault injection scan cell are in scan shift mode |

As indicated in the table, combined fault injection scan cell and internal scan cell 900 allows for various combinations for usage of the fault injection and scan functionality. Note that the fault injection scan circuitry of FIG. 9 can be implemented without internal scan cell functionality by removing multiplexer 730, SI 710 signal, and FI_Mode 714 signal and reconnecting the output of the multiplexer 728 to the logic 1 selection input signal of the multiplexer 732 from the circuit where were described above.

In an alternative embodiment, a dedicated single cell fault injection circuit with one F_Sel signal is implemented with the following changes:
a) F_Sel_0 is originated from fault injection scan cell and controls logic value of the fault being injected. When F_Sel_0=0 injects logic 0 upset fault and F_Sel_0=1 injects logic 1 upset fault.
b) F_Control signal is a global control signal and it controls one or more fault injection scan cells When F_Control=1 enables fault injection operation and F_Control=0 bypasses fault injection operation.

With these differences, the decoding circuit and the resulting Karnaugh map are as in the above-described circuit.

There are following differences in utilizing this type of fault injection scan cell for the enhanced fault injection flexibilities.
a) Fault type is controlled from the fault list and fault type is controllable per each fault injection scan cell with F_Sel_0.
I. If F_Sel_0 is logic 0 and F_Control is logic 1, then logic zero upset fault is enabled
II. If F_Sel_0 is logic 1 and F_Control is logic 1, then logic one upset fault is enabled
III. If F_Control is logic 0 then fault injection operation is bypassed regardless of F_Sel_0 logic status.
b) Fault injection control F_Control signal is a global control signal and there are following variations of implementation.

I. Single global signal from the fault list during each fault injection operation controlling fault injection operation by software functions or hardware modules or blocks.
II. Multiple fault injection registers from the fault list during each fault injection operation controlling fault injection operation per groups of registers or selected fault injection scan cells.
III. These two functions can be linked to software and hardware functions such that "F_Control" can be synchronized with software and hardware functions in addition to the fault list and fault injection clock control circuit to provide more flexibilities.
IV. For fault injection probe application, "F_Control" signal can be driven from the derivative function of "Fault_SE" signal say "F_Control_n" where single or multiple fault injection operations are performed while "Fault_SE" signal is active. The "F_Control_n" has the same duration as the "Fault_SE" and has following variations of control.
  i. F_Control_n is single cycle logic upset fault and it becomes active either rising or falling edge of the clock
  ii. F_Control_n is multiple cycles logic upset fault, i.e., burst error and it is not a stuck-at fault since it is relatively short clock cycles than stuck-at fault. There are two different variations of F_Control_n control:
    During the active cycle which is logic 1, the F_Control_n logic value stays constant as an active state
    During the active cycle which is logic 1, the F_Control_n logic value changes each clock cycle starting from logic value of 1 or predetermined sequences of different F_Control_n logic value for the duration.
    During the active cycle which is logic 1, the F_Control_n logic value is controlled by an external logic signal value Indeed, any of fault injection scan cells described herein can be converted into this type of implementation and can achieve similar functionality. Instead of using existing functional flip-flops for the fault injection purposes, this type of implementation can be used in any part of logic signal node as a "fault injection probe" due to its ability to control different types of fault per each probe node with minimum overhead.

Example of Dedicated Dual Cell Fault Injection Circuit

Figure 10:
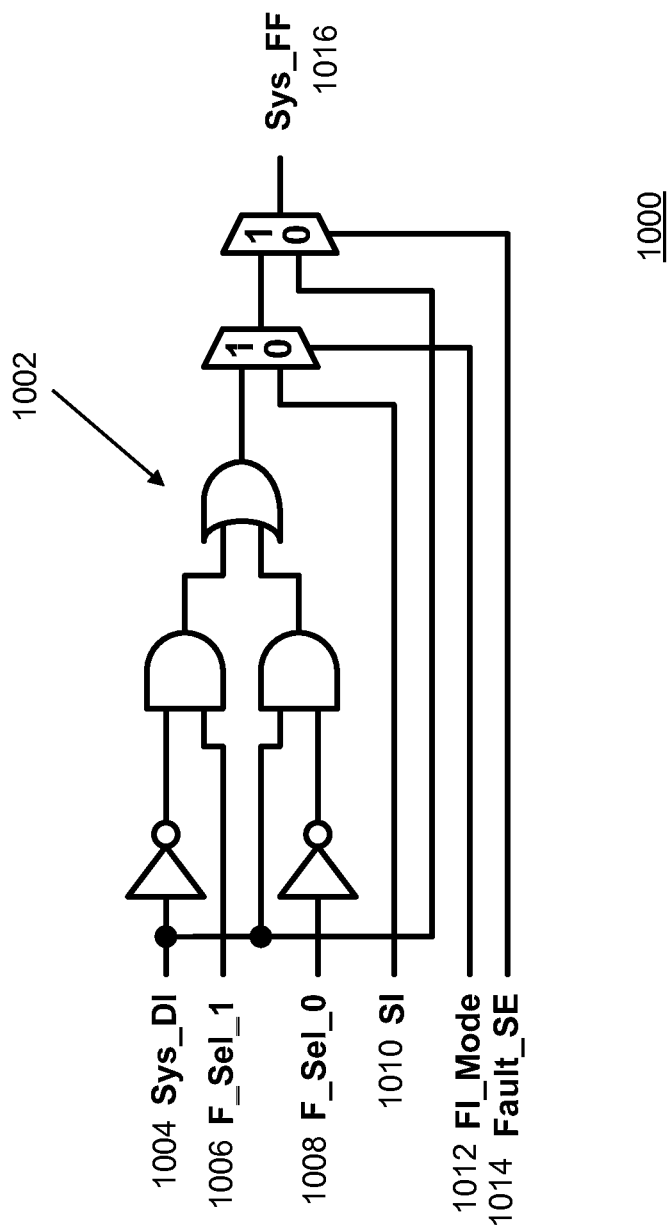
FIG. 10 is a schematic of a dual cell fault injection circuit according to an embodiment of the invention.
Figure 11:
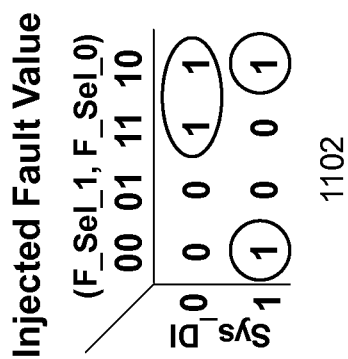
FIG. 11 is a Karnaugh map of a dual cell fault injection circuit according to an embodiment of the invention.

Turning now to FIG. 10 there is shown a dedicated dual fault injection scan cell 1000 according to the present invention. Dedicated dual fault injection scan cell 1000 includes logic circuitry 1002 that implements the functionality of Karnaugh maps 1102 of FIG. 11.

As shown in FIG. 10, fault selection is controlled by F_Sel_0 1008 and F_Sel_1 1006. System core data input is provided at Sys_DI 1004 and internal scan serial input is provided at SI 1010. Fault injection mode is controlled by FI_Mode 1012 and a fault injection scan enable mode is controlled by Fault_SE 1014. Output Sys_FF 1016 provides system core data output during operation of dual fault injection scan cell 1000.

Figure 12:
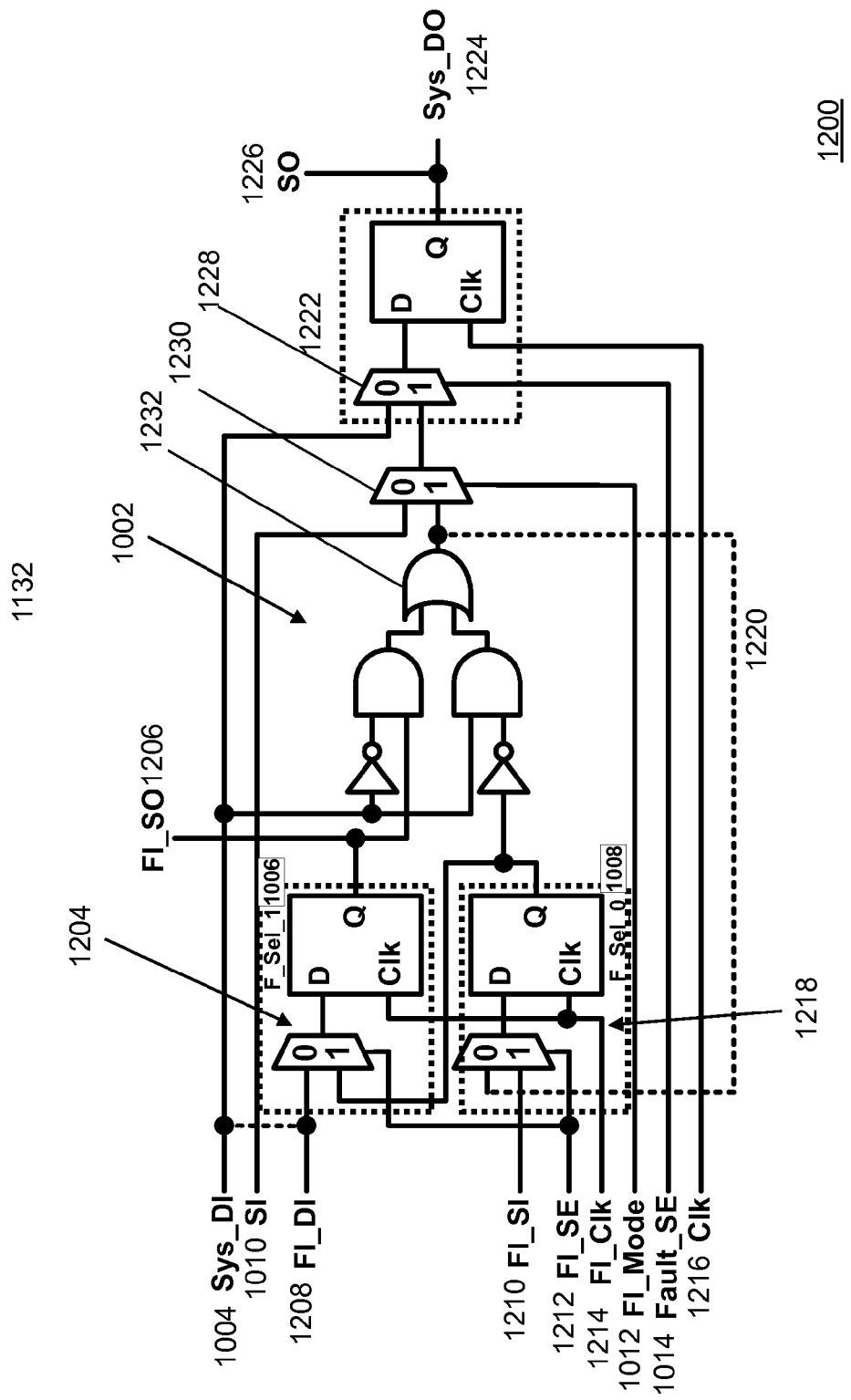
FIG. 12 is a schematic of a dual cell fault injection circuit according to an embodiment of the invention.

Shown in FIG. 12 is combined dual fault injection scan cell and internal scan cell circuit 1200 that includes dual cell fault injection circuit 1000 that further includes logic circuitry 1002 and the various signals described with reference to combined dual fault injection scan cell and internal scan cell circuit 1200.

As shown, combined dual fault injection scan cell and internal scan cell circuit 1200 is configured to simultaneously receive and separately store fault injection status data FI_DI 1208 and fault injection data 1220. More particularly, FI_DI 1208 that provides fault injection capture status data input is coupled to be received by flip-flop 1222 and FI_DI 1208 that provides fault injection data to fault injection scan flip-flops is coupled to be received by flip-flop 1204. The outputs of both of these flip-flops are subsequently input to logic circuitry 1002.

Moreover, FI_SE 1212 that provides fault injection scan enable mode control, and FI_Clk 1214 that provides a fault injection shift clock and is used as a capture signal during a fault injection capture cycle. Combined fault injection scan cell and internal scan cell 1222 further includes Clk 1216 that provides a clocking input to flip-flop of the internal scan cell 1222 that, in turn, provides Sys_DO 1224 that is a system core data output during operation of dual fault injection scan cell and internal scan cell circuit 1200 and SO 1226 that is a serial output of the internal scan flip-flop 1222.

Shown in the table below are the various states of [F_Sel_0, F_Sel_1] and a description of the captured value of the fault injection scan flip-flops during fault injection operation of dual fault injection scan cell and internal scan cell circuit 1200. The responsive information can be used to estimate system SER and other fault injection results.

| Fault Injection control Flip-flip | Capture value during fault injection |
| --- | --- |
| F_Sel_0 | Logic status of fault being injected. |
| F_Sel_1 | System node value at the time of fault injection |

Note that instead of global signals (F_Sel_1 704 and F_Sel_0 708 of FIG. 7) being routed to individual fault injection scan cells, signals F_Sel_1 1006 and F_Sel_0 1008 are loaded into two fault injection control cells. Because there are two control signals for the one functional flip-flop, the signal F_Control 706 of FIG. 7 is not needed in this embodiment of the invention.

Further note that dual fault injection scan circuitry of circuit 1200 can be implemented without an internal scan cell functionality by removing multiplexer 1230, SI 1010 signal, FI_Mode 1012 signal, and reconnecting the output of the 2 input OR gate 1232 to the logic 1 selection input signal of the multiplexer 1228 from the circuit which were described above.

Example of Dedicated Alternative Single Cell Fault Injection Circuit

Figure 13:
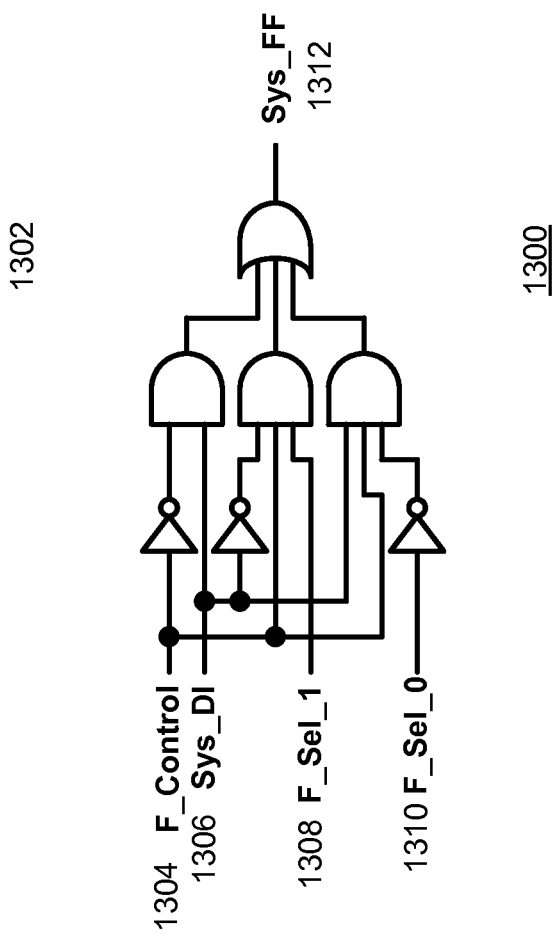
FIG. 13 is a schematic of a single cell fault injection circuit according to an embodiment of the invention.

Shown in FIG. 13 is a dedicated single cell fault injection circuit 1300 that is an alternative embodiment of single cell fault injection circuit 700. Notable in single cell fault injection circuit 1300 is that it uses fully decode fault injection values instead of selecting fault injection values through multiplexers. As shown, single cell fault injection circuit 1300 does not include logic circuitry 702. Fault selection is controlled by F_Sel_0 1310 and F_Sel_1 1308. Fault injection is controlled by F_Control 1304 where F_Control 1304 set to 1 activates fault injection and F_Control 1304 set to 0 deactivates or bypasses fault injection. System core data input is provided at Sys_DI 1306. Output Sys_FF 1312 provides fault injection data to the system core data output during operation of single cell fault injection circuit 1300.

Shown in FIG. 14 is Karnaugh maps 1402 that describes the operation of fault injection circuit 1300. More particularly, Karnaugh map 1402 describes the complete operation of fault injection circuit 1300.

Figure 15:
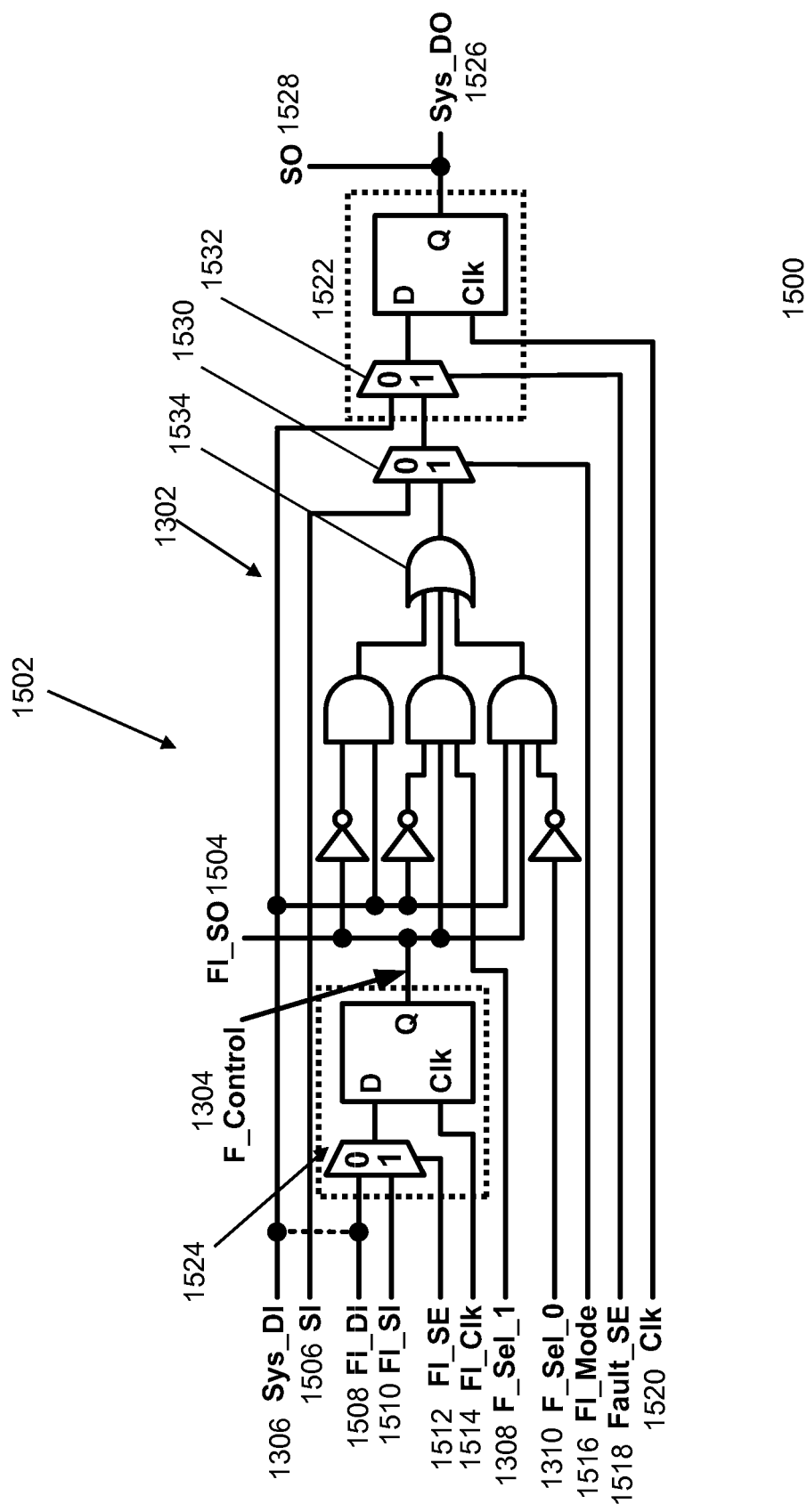
FIG. 15 is a schematic of a single cell fault injection circuit according to an embodiment of the invention.

Shown in FIG. 15 is combined fault injection scan cell and internal scan cell 1500 that includes single cell fault injection circuit 1300 that further includes logic circuitry 1302 and the various signals described with reference to fault injection circuit 1300. Combined fault injection scan cell and internal scan cell 1300 includes FI_DI 1508 that provides fault injection capture data input, FI_SI 1510 that provides fault injection serial input to fault injection scan flip-flops 1524, FI_SE 1512 that provides fault injection scan enable mode control, and FI_Clk 1514 that provides a fault injection shift clock and is used as a capture signal during a fault injection capture cycle. Combined fault injection scan cell and internal scan cell 1500 further includes Clk 1520 that provides a clocking input to flip-flop of the internal scan cell 1522 that, in turn, provides Sys_DO 1526 that is a system core data output during operation of combined fault injection scan cell and internal scan cell 1500 and SO 1528 that is a serial output of the internal scan flip-flop 1522.

An important consideration of combined fault injection scan cell and internal scan cell 1500 is the interaction of FI_SE 1512 and FI_Mode 1516. Shown in the table below are the various states of [FI_SE, FI_Mode] and a description of the responsive operation of combined fault injection scan cell and internal scan cell 1500.

| FI_SE | FI_Mode | Description |
|---|---|---|
| 0 | 0 | Both the fault injection scan cell and internal scan cell are in functional mode which is non-scan shift mode |
| 0 | 1 | Internal scan cell is in scan shift mode, fault injection scan cell is in functional mode |
| 1 | 0 | Internal scan cell is in functional mode, fault injection scan cell is in shift mode |
| 1 | 1 | Both internal scan cell and fault injection scan cell are in scan shift mode |

As indicated in the table, combined fault injection scan cell and internal scan cell 1500 allows for various combinations for usage of the fault injection and scan functionality. Note that the fault injection scan circuitry of FIG. 15 can be implemented without internal scan cell functionality by removing multiplexer 1530, SI 1506 signal, FI_Mode 1516 signal, and reconnecting the output of the 3 input OR gate 1534 to the logic 1 selection input signal of the multiplexer 1532 from the circuit where were described above.

Example of Dedicated Single Cell Fault Injection Circuit with One F_Sel Signal

Figure 16:
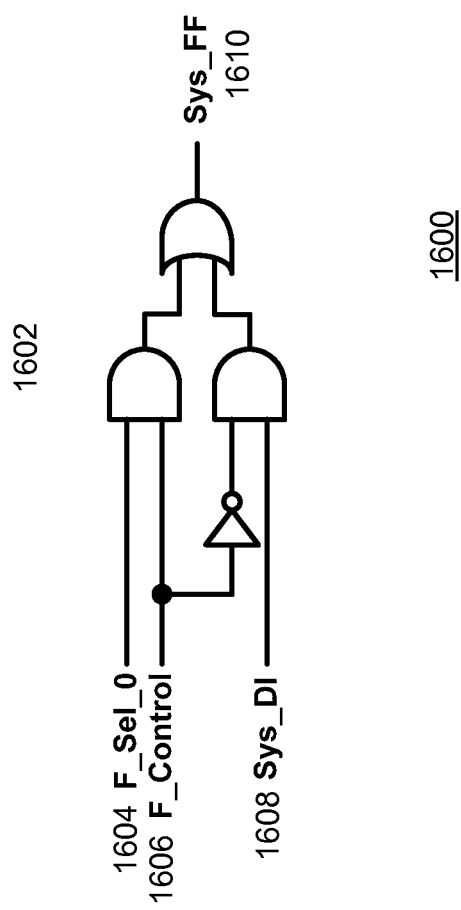
FIG. 16 is a schematic of a single cell fault injection circuit according to an embodiment of the invention.

Shown in FIG. 16 is an alternative embodiment for a dedicated single cell fault injection circuit 1600 that includes logic circuitry 1602. Notable in single cell fault injection circuit 1600 is that it uses only one fault select signal, F_Sel_0, that provides global control of fault injection. Single cell fault injection circuit 1600, therefore, provides a simplification that, in turn, provides for reduced routing of signals and reduced circuit overhead.

In single cell fault injection circuit 1600 fault selection is controlled by F_Sel_0 1604 only. Fault injection is controlled by F_Control 1606 where F_Control 1606 set to 1 activates fault injection and F_Control 1606 set to 0 deactivates or bypasses fault injection. System core data input is provided at Sys_DI 1608. Output Sys_FF 1500 provides system core data output during operation of single cell fault injection circuit 1600.

Shown in FIG. 17 is Karnaugh maps 1702 that describes the operation of fault injection circuit 1600.

Figure 18:
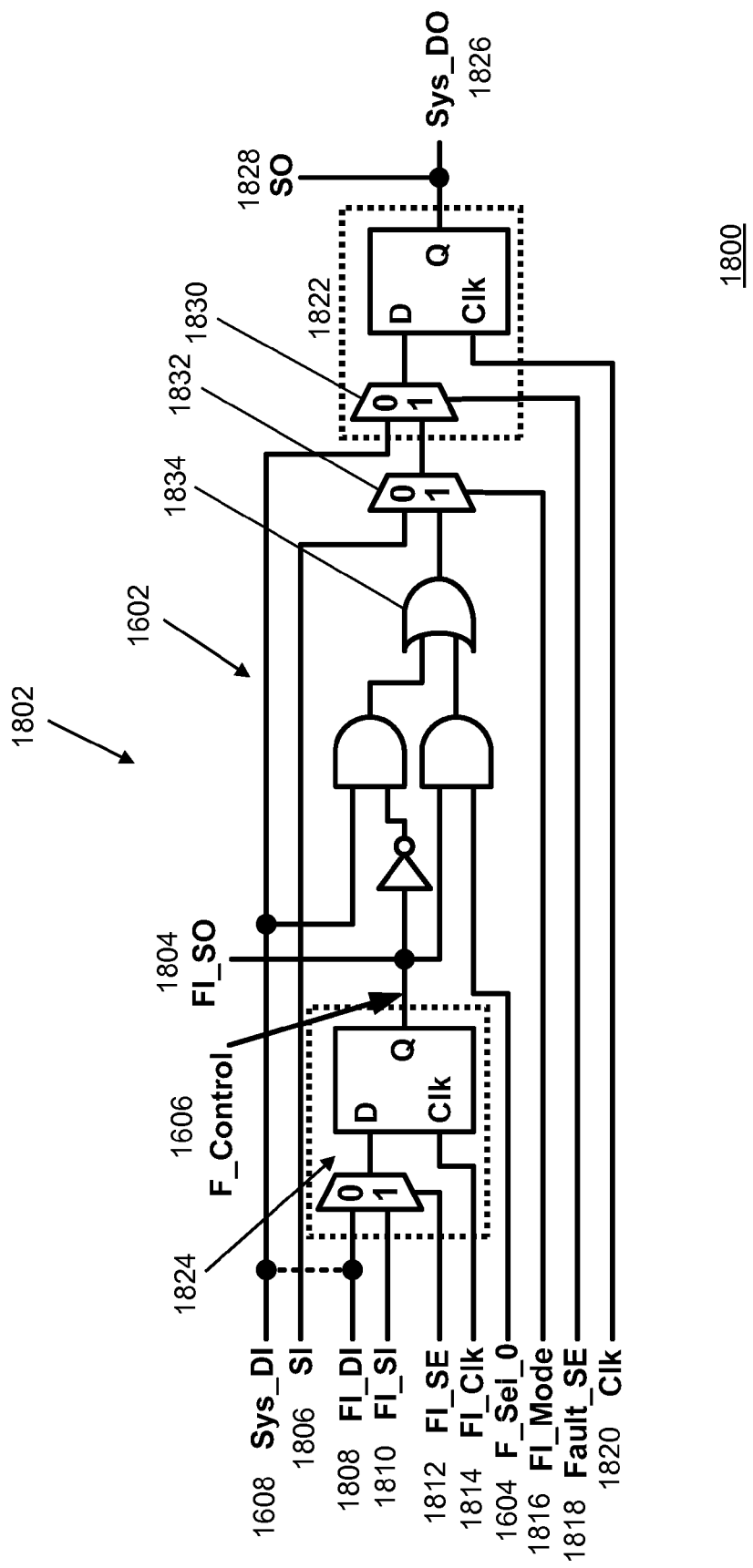
FIG. 18 is a schematic of a single cell fault injection circuit according to an embodiment of the invention.

Shown in FIG. 18 is combined fault injection scan cell and internal scan cell 1800 that includes single cell fault injection circuit 1600 that further includes logic circuitry 1602 and the various signals described with reference to fault injection circuit 1300. Combined fault injection scan cell and internal scan cell 1800 includes FI_DI 1808 that provides fault injection capture data input, FI_SI 1810 that provides fault injection serial input to fault injection scan flip-flops 1824, FI_SE 1812 that provides fault injection scan enable mode control, and FI_Clk 1814 that provides a fault injection shift clock and is used as a capture signal during a fault injection capture cycle. Combined fault injection scan cell and internal scan cell 1800 further includes Clk 1820 that provides a clocking input to flip-flop of the internal scan cell 1822 that, in turn, provides Sys_DO 1826 that is a system core data output during operation of combined fault injection scan cell and internal scan cell 1800 and SO 1828 that is a serial output of the internal scan flip-flop 1822.

An important consideration of combined fault injection scan cell and internal scan cell 1800 is the interaction of FI_SE 1812 and FI_Mode 1816. Shown in the table below are the various states of [FI_SE, FI_Mode] and a description of the responsive operation of combined fault injection scan cell and internal scan cell 1800.

| FI_SE | FI_Mode | Description |
|---|---|---|
| 0 | 0 | Both the fault injection scan cell and internal scan cell are in functional mode which is non-scan shift mode |
| 0 | 1 | Internal scan cell is in scan shift mode, fault injection scan cell is in functional mode |
| 1 | 0 | Internal scan cell is in functional mode, fault injection scan cell is in shift mode |
| 1 | 1 | Both internal scan cell and fault injection scan cell are in scan shift mode |

As indicated in the table, combined fault injection scan cell and internal scan cell 1800 allows for various combinations for usage of the fault injection and scan functionality. Note that the fault injection scan circuitry of FIG. 18 can be implemented without internal scan cell functionality by removing multiplexer 1832, SI 1806 signal, FI_Mode 1816 signal, and reconnecting the output of the 2 input OR gate 1834 to the logic 1 selection input signal of the multiplexer 1530 from the circuit where were described above.

Shown in the table below are fault injection control and status capture values with the F_Control 1606 and F_Sel_0 1604 signals. Due to the reduction in fault selection signals, EXOR-type logic toggle upset fault injection is not supported in this embodiment; only logic 0 upset and logic 1 upset fault are supported.

| Fault Type | F_Control | F_Sel_0 | System Node Value | Injected Fault Value | Fault Effect |
|---|---|---|---|---|---|
| Bypass | 0 | 0 | 0 | 0 | bypass |
|  |  |  | 1 | 1 | bypass |
|  |  | 1 | 0 | 0 | bypass |
|  |  |  | 1 | 1 | bypass |
| Logic 0 Upset Fault | 1 | 0 | 0 | 0 | transparent |
|  |  |  | 1 | 0 | effective |
| Logic 1 Upset Fault |  | 1 | 0 | 1 | effective |
|  |  |  | 1 | 1 | transparent |

Figure 19:
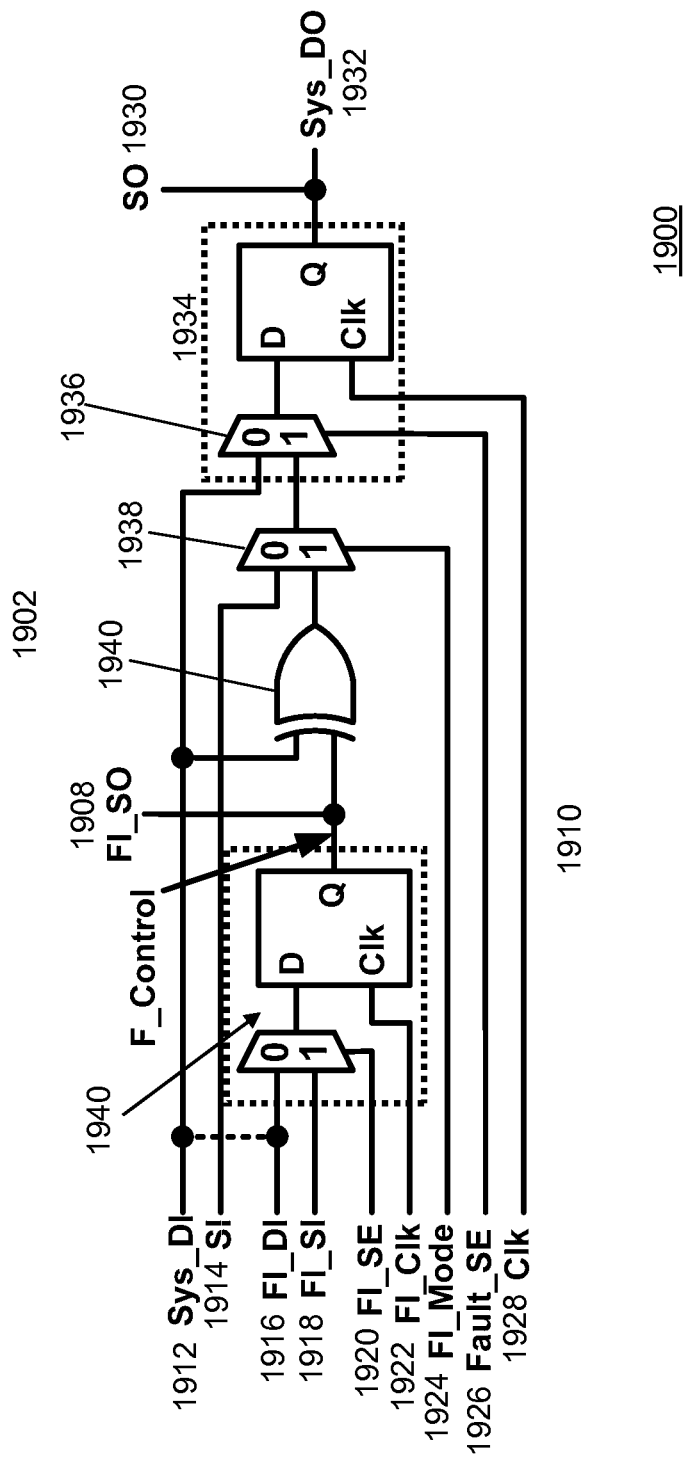
FIG. 19 is a schematic of a single cell fault injection circuit according to an embodiment of the invention.

Example of Dedicated Single Cell EXOR Only Fault Injection Circuit with Scan Support Shown in FIG. 19 is combined fault injection scan cell and internal scan cell 1900 that includes single cell fault injection circuit 1902 that implements an EXOR operation. More specifically, single cell fault injection circuit 1902 supports only toggle upset fault injection, and in operation, there will not be any transparent faults since all the injected faults will always be a complementary value of the logic state of a given node.

There are no global fault selection control signals F_Sel_0 and F_Sel_1. Accordingly, circuit and routing complexity are reduced. For every fault injection scan cell with F_Control 1908 set to 1, the injected fault will always be an effective fault and a fault will be injected. When F_Control 1908 is set to 0, it is a bypass condition and no fault will be injected.

Combined fault injection scan cell and internal scan cell 1900 includes FI_DI 1916 that provides fault injection capture data input, FI_SI 1918 that provides fault injection serial input to fault injection scan flip-flop 1940, FI_SE 1920 that provides fault injection scan enable mode control, and FI_Clk 1922 that provides a fault injection shift clock and is used as a capture signal during a fault injection capture cycle. Combined fault injection scan cell and internal scan cell 1900 further includes Clk 1928 that provides a clocking input to flip-flop 1934 that, in turn, provides Sys_DO 1932 that is a system core data output during operation of combined fault injection scan cell and internal scan cell 1900 and SO 1930 that is a serial output of the internal scan flip-flop 1934.

An important consideration of combined fault injection scan cell and internal scan cell 1900 is the interaction of FI_SE 1920 and FI_Mode 1924. Shown in the table below are the various states of [FI_SE, FI_Mode] and a description of the responsive operation of combined fault injection scan cell and internal scan cell 1500.

| FI_SE | FI_Mode | Description |
|---|---|---|
| 0 | 0 | Both the fault injection scan cell and internal scan cell are in functional mode which is non-scan shift mode |
| 0 | 1 | Internal scan cell is in scan shift mode, fault injection scan cell is in functional mode |
| 1 | 0 | Internal scan cell is in functional mode, fault injection scan cell is in shift mode |
| 1 | 1 | Both internal scan cell and fault injection scan cell are in scan shift mode |

As indicated in the table, combined fault injection scan cell and internal scan cell 1900 allows for various combinations for usage of the fault injection and scan functionality. Note that the fault injection scan circuitry of FIG. 19 can be implemented without internal scan cell functionality by removing multiplexer 1938, SI 1914 signal, FI_Mode 1924 signal, and reconnecting the output of the 2 input EXOR gate 1940 to the logic 1 selection input signal of the multiplexer 1936 from the circuit where were described above.

The following table shows the state of F_Control based on fault injection control and status capture values. The fault injection status capture value is the same value as "System Node Value" during fault injection. In this mode of operation, only EXOR type logic upset toggle fault injection is supported.

| Fault Type | F_Control | System Node Value | Injected Fault Value | Fault Effect |
|---|---|---|---|---|
| Bypass | 0 | 0 | 0 | bypass |
|  |  | 1 | 1 | bypass |
| Logic Toggle | 1 | 0 | 1 | effective |
| Upset Fault |  | 1 | 0 | effective |

Example of Dedicated Single Cell EXOR only Fault Injection Circuit

Figure 20:
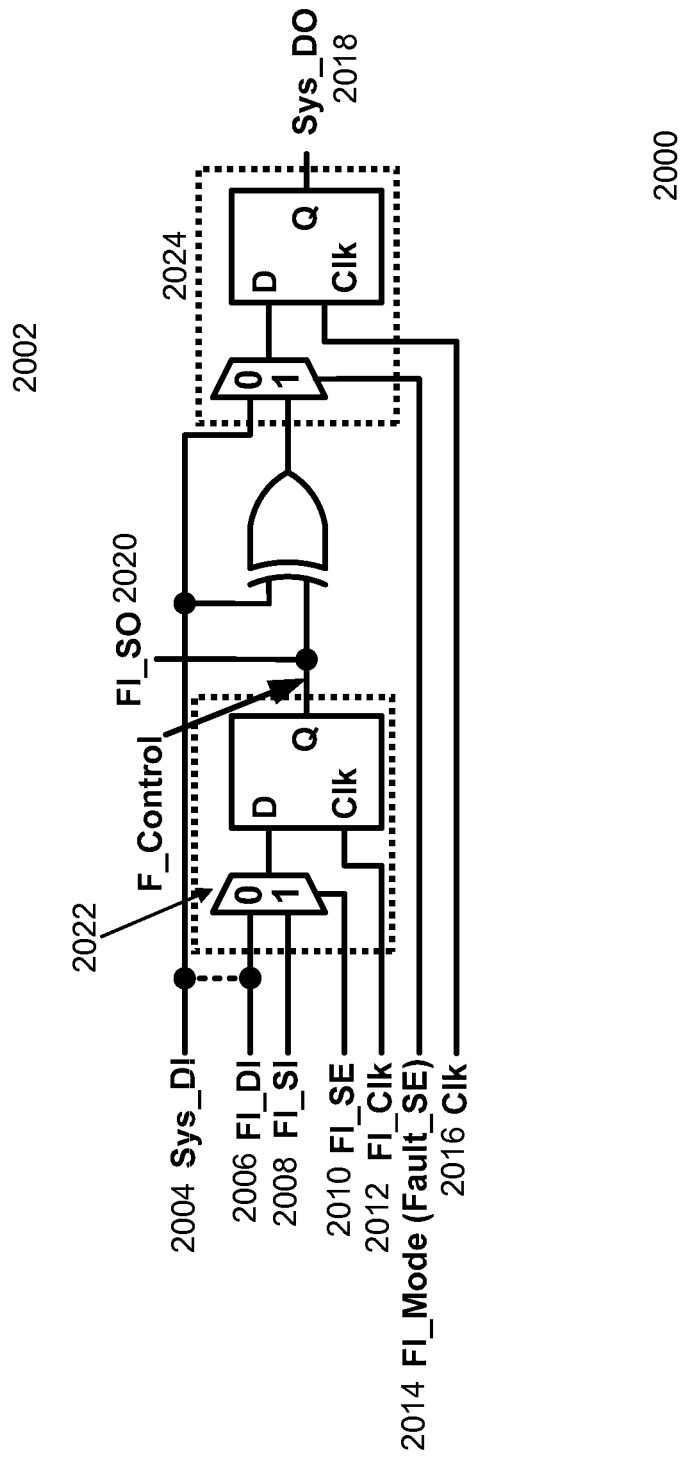
FIG. 20 is a schematic of a single cell fault injection circuit according to an embodiment of the invention.

Shown in FIG. 20 is fault injection scan cell 2000 that is similar to combined fault injection scan cell and internal scan cell 1900 with the notable difference that fault injection scan cell 2000 does not include internal scan chain support. This simplification is achieved by removing multiplexer 1938 of FIG. 19, SI 1914 signal, FI_Mode 1924 signal, and reconnecting the output of the 2 input EXOR gate 1940 to the logic 1 selection input signal of the multiplexer 1936. Importantly, fault injection scan cell 2000 utilizes substantially reduced circuit and routing overhead from among the various fault injection scan cells discussed above. All decoding functions and captured fault injection status value from FIG. 19 are substantially similar in FIG. 20 and fault injection scan cell 2000.

Fault Injection Clock Control

In the present invention, a fault injection clock control circuit generates fault injection clock pulses and fault injection status captures clock pulses. These pulses are generated for the fault injection scan cells to perform successful fault injection operation.

Generally, two types of clock control circuit to generate both clock pulses:

a) Single Fault Injection Clock Controller—generates clock pulses for the fault injection circuits.

b) Fault Injection Clock Controller—generates synchronizing signals that are distributed globally to the local synchronizers that generate a fault injection clock pulse and a fault injection status captures clock pulse locally. This approach minimizes clock signal degradation and maintains signal integrities in the large design.

Different interface types can be used for the fault injection clock control circuit, such as:

a) Internal Scan Signal Interface b) Boundary-Scan Test Access Port (TAP) Controller Above, the signal Fault_SE was described. Further details are provided here. In an embodiment, the signal Fault_SE controls a multiplexer of the functional flip-flop, which, in an application, is an internal scan cell's input multiplexer. During a functional operation, internal scan enable signal (SE) is inactive such that system input signal (Sys_DI) is fed to the flip-flop by the multiplexer instead of serial input signal (SI).

During a fault injection cycle, the fault injection clock controller generates a clock pulse to control the multiplexer for the duration of the fault injection time. This clock pulse is fed into the signal Fault_SE. The clock pulse is normally one system clock cycle long and has active high logic state such that when the clock pulse is active the multiplexer is forced to select the SI input path of the signal instead of system input signal (Sys_DI). Since SI input is then shared with output of the fault injection scan cell during fault injection operation, decoded function of the fault injection scan cell value (F_Control), which is also FI_SO, is fed to the functional flip-flop through the multiplexer. At the next rising edge of system clock, the injected fault value present at the output of the multiplexer, which is D input of the flip-flop as well, is being latched into the functional flip-flop thus completing the fault injection operation.

If the fault injection clock pulse lasts only one system clock cycle, the fault will persist for only one system clock cycle in the flip-flop. The effect resembles the behavior of a flip-flop SEU. However subsequent system clock pulses will move the injected fault from the flip-flop further into the downstream flip-flops or output of the flip-flop may be blocked by the downstream combinational logics. Analyzing injected fault propagation effects are the main purpose of fault injection operation.

The signal FI_Capture will now be further described. The signal FI_Capture controls clock input of the fault injection scan cell. In an embodiment, the clock pulse coincides with the Fault_SE clock pulse such that system input value is captured during a fault injection operation. The captured value will be unloaded as a next fault list is loaded into fault injection scan cell and is used to identify actual fault injection status.

In an embodiment, the signal FI_Capture is falling edge synchronized while Fault_SE is synchronized with the rising edge of the clock such that FI_Capture occurs a half-cycle earlier than the Fault_SE pulse. Depending on the fault injection application and the fault injection circuit size, synchronizing the FI_Capture and Fault_SE pulses with respect to system clock may vary in order to maintain signal integrity of the generated pulses.

A key point of aligning FI_Capture and Fault_SE pulses with the proper system clock edge is to ensure that fault injection status capture and fault injection happens during the same system clock cycles. What this means is that capture flip-flop and system flip-flop are capturing at the same system cycle data in regard to the edge of the clocks used in the both flip-flops, whether they are the same clock edge or not.

Combinations and Applications of Fault Injection Circuit

Of the various fault injection circuits described above, each has different fault injection flexibility and circuit overhead. As currently contemplated, there are seven different functional combinations to consider when choosing optimum fault injection circuit for a given application:

- With and without incorporating internal scan functions
- With or without incorporating fault injection scan cell
- Use of one F_Sel_0 or both F_Sel_0 and F_Sel_1 global fault selection signals
- Use of EXOR only logic upset fault injection function
- Use of both F_Sel_0 and F_Control signals either from the fault injection scan cell or from the global control signal
- Use of single or multiple clock cycle for fault injection with constant or time variant fault injection values
- Fault injection for a functional flip-flop, or single or multiple signal nodes These different functions can be mixed to meet fault injection requirements of the given CUT. It is to be appreciated that many other alternatives are possible without deviating from the teachings of the present invention.

In addition, the following design criteria may require different fault injection circuits and fault injection applications:

a) FPGA development environment where fault injection scan circuits will not be part of the final product and the fault injection operations are done in prototyping stages of development b) ASIC design environment where fault injection scan circuits will not be part of the final product and the fault injection operations are done in simulation stages of development. The simulation can be in the form of SW simulation or SW and HW co-simulation environment.

c) ASIC design environment where a part or all part of fault injection scan circuits will be in the final product and the fault injection operations can be done in simulation stages of development and in the final system environment. Simulation can be in the form of SW simulation or SW and HW co-simulation environment.

d) IP or μP core design environment where part or all part of fault injection scan circuits will be in the final product and the fault injection operations can be done in simulation stages of development and in the final system environment. Simulation can be in the form of SW simulation or a SW and HW co-simulation environment. In this application, a part or all of the fault injection scan circuits can be included in the ASIC design environment where the core is incorporated as a part of the design.

Fault Injection Scan Insertion Example

Fault injection scan chain insertion is similar to internal scan insertion rules, guidelines, and methodologies especially for multiple clock domains, scan chain domain crossings, scan chain ordering, DFT rule checking, and scan chain stitching. Fault injection scan chain insertion generally follows similar rules and practices of the well-known internal scan insertion rules and guidelines for successful fault injection operation with the scan operation.

There are two different types of fault injection scan chains;

a) Fault Injection Scan Chain is operational when system clock is under control: This type of scan chain injects faults during scan shift operation. The timing requirements for fault injection and fault status capture need not be stringent. Only scan shift operation and maximum shift speed are generally determinative of successful fault injection operations.

b) Fault Injection Scan Chain is operational concurrent with system operation: This type of scan chain injects faults when FI_SE is in an inactive state, known as capture cycle after shift operation is completed. Fault status capture is performed at this stage as well. Fault injection in this situation requires more stringent timing accuracies for scan shift operation, fault injection, and fault status capture during fault injection operation.

Fault Injection Scan Chain Insertion Methods Overview

Common scan chain insertion methods that are available in modern DFT tools can be used for fault injection with limited issues. A general scan insertion process involves the following activities assuming that the design meets generic scan DFT rules for scan insertion and operation.

a) Identify all flip-flops in a design;

b) Replace the flip-flops with fault injection scan flip-flops or replace flip-flops with internal scan flip-flops and then convert to fault injection scan flip-flops. At this stage, all flip-flops or selected number of flip-flips in the a design can be used for fault injection scan flip-flop;

c) Insert lock-up latches if necessary to meet scan DFT rules;

d) Connect each flip-flop input and output to system input and output data signals;

e) Provide SI and SO connections for both scan chains (e.g., connect serial input and output signals to and from next and previous scan flip-flops);

f) Provide scan chain control signals for both scan chains;

g) Connect fault injection control and capture clocks with or without local capture clock synchronizer implementation; and h) Perform scan chain integrity test for both scan chains including fault status capture.

The above, provides a general guideline for scan insertion operation but is not specific to any tool available in the market.

Fault Injection Scan Chain Application Differences

As noted earlier for the concurrent fault injection operations, internal scan chains need to be in a functional mode. The following list summarizes two different approaches.

- a) Clock controlled fault injection circuit: scan chains are inserted with existing DFT tools or use scan ATPG ready netlists for fault injection circuit insertion. Additional scan control and clock control circuitry is inserted to complete the necessary fault injection circuits.
- b) Concurrent fault injection circuit: internal scan chains and fault injection scan chains are inserted with using a scan insertion tool as may be available now or in the future. Additional scan control and clock control circuitry are inserted to complete the necessary fault injection circuits.

Modern scan insertion tools provide functionality that can assist with both internal scan chains and fault injection scan cells. Indeed, one of scan insertion operation, a fault injection scan insertion, or a scan conversion operation can be used to insert fault injection scan chains.

As currently contemplated, there are at least three different application types with fault injection scan chains and related circuitry:

- a) Use fault injection scan chains only during SEU simulation and analysis purposes. The final product will not contain fault injection scan chains.
- b) Use all or selected fault injection scan flip-flops during both SEU simulation and analysis purposes, as well as fault injection in the system environment of the final product.
- c) Use different sets of fault injection scan chains during SEU simulation and analysis purposes as well as system applications in the final product. Fault injection scan chains for each application have different sets of fault injection scan chains.

For each application, there are benefits and drawbacks such that a designer must aware of the specific SEU mitigation requirement and reliability goals.

Figure 21:
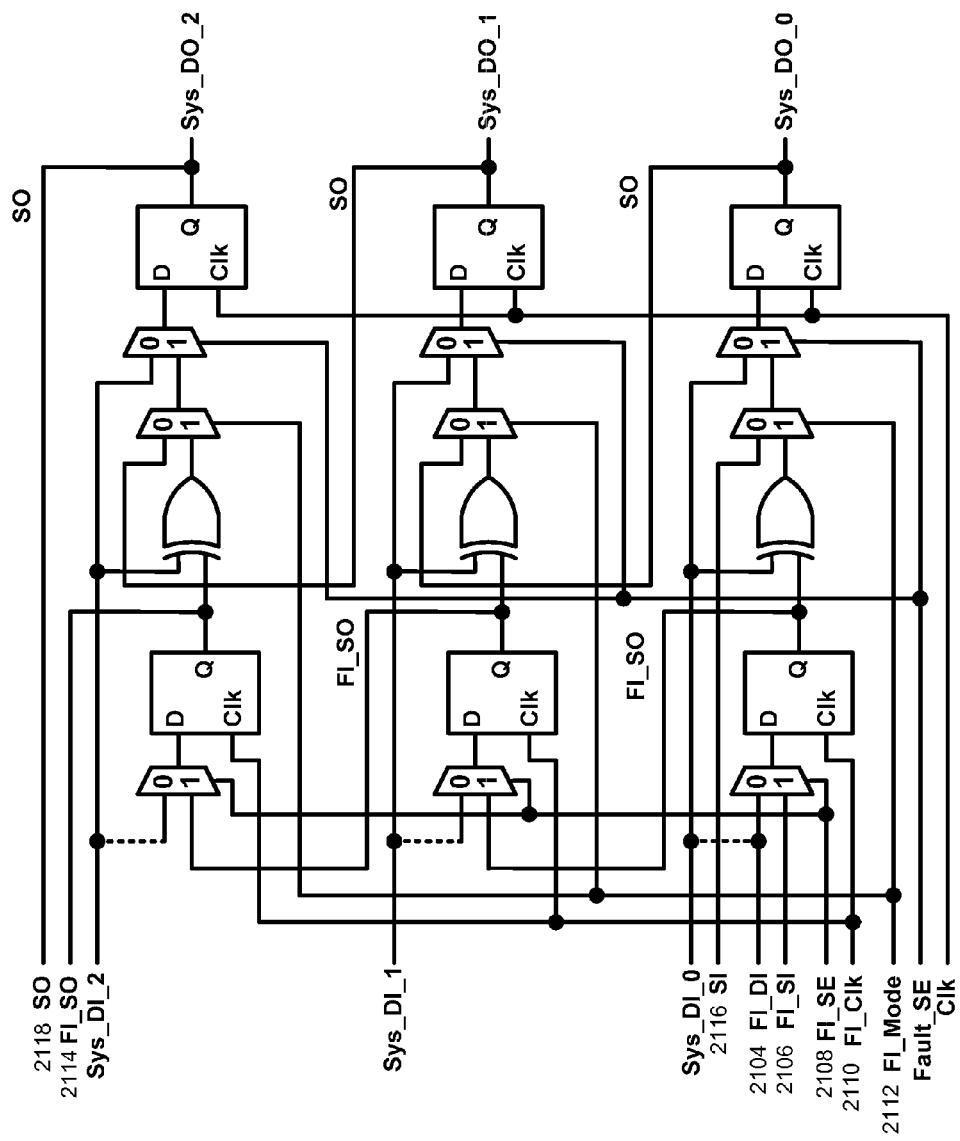
FIG. 21 is a schematic of a fault injection circuit according to an embodiment of the invention.

FIG. 21 includes a circuit 2100 that depicts various interconnections for the fault injection scan cell, the internal scan cell, and the associated scan control and clock signals according to an embodiment of the invention. As shown, signals FI_DI 2104, FI_SI 2106, FI_SE 2108, FI_Clk 2110, FI_Mode 2112, and FI_SO 2114 are fault injection scan chain serial data and control signals. Signals SI 2116 and SO 2118 are internal scan chain serial data signals. These various signals and their interaction in the fault injection circuits of the present invention were described above. It is important to note that for both fault injection scan chain and internal scan chain use, the same internal scan chain operating principles and protocols can apply.

Indeed, the various fault injection circuits of the present invention can be analogously implemented as shown in FIG. 21. Note that if fault injection is done using a clock controlled method, scan chains that are used for the fault injection are substantially the same as the internal scan chain. Otherwise, the fault injection scan chain and the related clock circuitry have to be inserted in conjunction with or without internal scan support. If long scan chains are used, scan chains can be segmented into multiple shorter scan chains for easy access and control. This applies to both clock controlled or concurrent fault injection approaches.

It should be appreciated by those skilled in the art that the specific embodiments disclosed above may be readily utilized as a basis for modifying or designing other fault injection circuits. It should also be appreciated by those skilled in the art that such modifications do not depart from the scope of the invention as set forth in the appended claims.

What is claimed is:

1. A fault injection circuit, comprising:
    a boundary scan chain having a first serial input and a first serial output and further having a first plurality of scan cells;
    logic circuitry having a second serial output coupled to the first serial input of the boundary scan chain and a second serial input coupled to the first serial output of the boundary scan chain, wherein the logic circuitry is configured to receive data from the boundary scan chain, and wherein the logic circuitry includes
        a first control circuit that controls a type of fault to be created by the logic circuitry, and
        a second control circuit that alternatively selects between passing a second plurality of faults created by the logic circuitry and passing a third plurality of received data from the first serial output of the boundary scan chain to the first serial input of the boundary scan chain wherein the collection of the second plurality of faults and the third plurality of received data is less than or equal to the first plurality of scan cells and wherein the second control circuit is configured to inject the second plurality of faults and the third plurality of received data into the first plurality of scan cells in a predetermined pattern.

2. The circuit of claim 1, wherein the type of fault created by the logic circuitry includes a forced zero.

3. The circuit of claim 1, wherein the type of fault created by the logic circuitry includes a forced one.

4. The circuit of claim 1, wherein the type of fault created by the logic circuitry includes an invert.

5. The circuit of claim 1, wherein the logic circuitry further includes a fault control signal that determines whether faults are to be injected or whether fault injection is to be bypassed.

6. The circuit of claim 1, wherein the first serial output of the boundary scan chain is stored in a register.

7. The circuit of claim 1, wherein the logic circuitry further includes a third control input that enables operation of the logic circuitry.

8. The circuit of claim 1, wherein the logic circuitry further includes a fourth control input that controls a mode of the fault injection circuit.

9. The circuit of claim 1, wherein the boundary scan chain is responsive to a first clock signal.

10. The circuit of claim 1, wherein the logic circuitry is responsive to a second clock signal.

11. A fault injection circuit, comprising:
    a first storage element having a first input configured to receive fault injection data and a first output;
    logic circuitry that includes
        a second serial output and a second serial input coupled to a third serial output of a boundary scan chain having a
        first plurality of scan cells, wherein the logic circuitry is configured to receive data from the boundary scan chain;
        a first control circuit that alternatively selects between passing a second plurality of faults stored in the first storage element and passing a third plurality received data from the third serial output of boundary scan chain to the second serial output wherein the collection of the second plurality of faults and the third plurality of received data is less than or equal to the first plurality of scan cells and wherein the first control circuit is configured to inject second plurality of faults and the third plurality of received data into the second plurality of scan cells in a predetermined pattern, and a fourth input coupled to the first output of the first storage element; and a second storage element having a fifth input coupled to the second serial output of the logic circuitry and having an output coupled to a third serial input of the boundary scan chain.

12. The circuit of claim 11, wherein the type of fault created by the logic circuitry includes a forced zero.

13. The circuit of claim 11, wherein the type of fault created by the logic circuitry includes a forced one.

14. The circuit of claim 11, wherein the type of fault created by the logic circuitry includes an invert.

15. The circuit of claim 11, wherein the logic circuitry further includes a fault control signal that determines whether faults are to be injected or whether fault injection is to be bypassed.

16. The method of claim 11, wherein the fault injection data includes predetermined data.

17. The circuit of claim 11, wherein the logic circuitry further includes a third control input that enables operation of the logic circuitry.

18. The circuit of claim 11, wherein the logic circuitry further includes a fourth control input that controls a mode of the fault injection circuit.

19. The circuit of claim 11, wherein the first storage element is responsive to a first clock signal.

20. The circuit of claim 11, wherein the second storage element is responsive to a second clock signal.

21. The circuit of claim 11, wherein the logic circuitry is responsive to a third clock signal.

22. A fault injection circuit, comprising:
a first storage element having a first input configured to receive a first data and having a first output;
a second storage element having second input configured to receive a second data and having a second output;
logic circuitry that includes
a third serial output and a third serial input coupled to a fourth serial output of a boundary scan chain, wherein the logic circuitry is configured to receive data from the boundary scan chain having a first plurality of scan cells;
a first control input that alternatively selects between passing a second plurality of faults stored in the first storage element, passing a third plurality of faults stored in the second storage element, and passing a fourth plurality of received data from the fourth serial output of the boundary scan chain to the third serial output wherein the collection of the second plurality of faults, the third plurality of faults, and the fourth plurality of received data is less than or equal to the first first plurality of scan cells and wherein the second control circuit is configured to inject the second plurality of faults, the third plurality of faults, and the fourth plurality of received data into the first plurality of scan cells in a predetermined pattern, a fifth input coupled to the first output of the first storage element, and a sixth input coupled to the second output of the second storage element; and a third storage element having seventh input coupled to the third serial output of the logic circuitry and having an output coupled to a fourth serial input of the boundary scan chain.

23. The circuit of claim 22, wherein the type of fault created by the logic circuitry includes a forced zero.

24. The circuit of claim 22, wherein the type of fault created by the logic circuitry includes a forced one.

25. The circuit of claim 22, wherein the type of fault created by the logic circuitry includes an invert.

26. The circuit of claim 22, wherein the logic circuitry further includes a fault control signal that determines whether faults are to be injected or whether data from the first or second storage element is to be bypassed.

27. The circuit of claim 22, wherein the logic circuitry further includes a third control input that enables operation of the logic circuitry.

28. The circuit of claim 22, wherein the logic circuitry further includes a fourth control input that controls a mode of the fault injection circuit.

29. The circuit of claim 22, wherein the first and second storage elements are responsive to a first clock signal.

30. The circuit of claim 22, wherein the third storage element is responsive to a second clock signal.

31. The circuit of claim 22, wherein the logic circuitry is responsive to a third clock signal.

32. A method for performing fault injection comprising:
receiving circuit data received from a scan chain associated with a circuit wherein the scan chain has a first plurality of scan cells;
generating a fault responsive to a first control signal;
selectively passing a second plurality of faults and a third plurality of received circuit data to the first plurality of scan cells of the scan chain responsive to a second control signal wherein the collection of the second plurality of faults and the third plurality of received data is less than or equal to the first plurality of scan cells and wherein the second plurality of faults and the third plurality of received data are injected into first plurality of scan cells in a predetermined pattern;
transmitting information stored in the scan chain storage element to logic circuitry.

33. The method of claim 32, wherein the type of fault is a forced zero.

34. The method of claim 32, wherein the fault is a forced one.

35. The method of claim 32, wherein the fault is an invert.

36. The method of claim 32, wherein the scan chain is a boundary scan chain.

37. The method of claim 32, further comprising enabling operation of the logic circuitry responsive to a third control signal.

* * * * *